United States Patent
Cohen et al.

(10) Patent No.: US 7,812,340 B2
(45) Date of Patent: Oct. 12, 2010

(54) STRAINED-SILICON-ON-INSULATOR SINGLE-AND DOUBLE-GATE MOSFET AND METHOD FOR FORMING THE SAME

(75) Inventors: Guy Moshe Cohen, Mehegan Lake, NY (US); Patricia May Mooney, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 910 days.

(21) Appl. No.: 10/460,628

(22) Filed: Jun. 13, 2003

(65) Prior Publication Data

US 2004/0253792 A1 Dec. 16, 2004

(51) Int. Cl.
*H01L 31/00* (2006.01)

(52) U.S. Cl. .................... 257/18; 257/288; 257/365; 257/E21.125; 257/E21.193

(58) Field of Classification Search ............ 438/296, 438/285, 216, 199, 149, 53; 257/616, 537, 257/510, 19, 67, 18, 28, 288, 365, E21.125, 257/E21.193

See application file for complete search history.

(56) References Cited

U.S. PATENT DOCUMENTS

| | | | |
|---|---|---|---|
| 4,685,198 A | | 8/1987 | Nomura et al. |
| 4,744,863 A | * | 5/1988 | Guckel et al. .............. 438/53 |
| 5,565,690 A | * | 10/1996 | Theodore et al. .............. 257/18 |
| 6,624,478 B2 | * | 9/2003 | Anderson et al. ............ 257/353 |
| 6,787,423 B1 | * | 9/2004 | Xiang .......................... 438/296 |
| 6,867,433 B2 | * | 3/2005 | Yeo et al. ........................ 257/67 |
| 7,074,623 B2 | * | 7/2006 | Lochtefeld et al. ............. 438/3 |
| 2004/0104447 A1 | | 6/2004 | Lee et al. |

FOREIGN PATENT DOCUMENTS

| | | |
|---|---|---|
| CN | 1348210 | 5/2002 |
| JP | 2002-184962 | 6/2002 |
| TW | 530385 | 5/2003 |
| WO | WO 02/071495 | 9/2002 |

OTHER PUBLICATIONS

Notification of Receipt of Demand By Competent International Preliminary Examining Authority dated Apr. 28, 2005, PCT/IPEA/402, PCT/IPEA/404.

Notification of Transmittal of the International Search Report and the Written Opinion of the International Searching Authority, or the Declaration, dated Mar. 11, 2005, PCT/ISA/220, PCT/ISA/210, PCT/ISA/237.

Notification Concerning Transmittal of International Application as Published or Republished dated Apr. 21, 2005, PCT/IB/311, WO 2004/114383 cover page.

(Continued)

*Primary Examiner*—Leonardo Andújar
*Assistant Examiner*—Monica D Harrison
(74) *Attorney, Agent, or Firm*—McGinn IP Law Group PLLC; Anne V. Dougherty, Esq.

(57) ABSTRACT

A method of forming a semiconductor structure (and the resulting structure), includes straining a free-standing semiconductor, and fixing the strained, free-standing semiconductor to a substrate.

7 Claims, 20 Drawing Sheets

OTHER PUBLICATIONS

P.M. Mooney, "Strain relaxation and dislocations in SiGe/Si structures", *Materials Science & Engineering Reports*, vol. R17 No. 3, Nov. 1, 1996, pp. 105-146.

Jean-Pierre Colinge, *Silicon-On-Insulator-Technology: Materials to VLSI*, 2nd Edition, Kluwer Academic Publishers, 1997, Chapter 1 pp. 1-5, Chapter 4 pp. 105-107.

G.M. Cohen, et al., "Free standing silicon as a compliant substrate for SiGe", Material Research Society 2003 Spring Meeting, Apr. 21-25, 2003.

A.M. Jones, et al., "Long-wavelength InGaAs quantum wells grown without strain-induced warping on InGaAs compliant membranes above a GaAs substrate", *Applied Physics Letters*, vol. 74 No. 7, pp. 1000-1002, Feb. 15, 1999.

P.M. Solomon, et al., "Two Gates Are Better Than One-A planar self-aligned double-gate MOSFET technology to achieve the best on/off switching ratios as gate lengths shrink", *IEEE Circuits & Devices Magazine*, vol. 19 No. 1, pp. 48-62, Jan. 2003.

Rim, et al., "Fabrication and Analysis of Deep Submicron Strained-Si N-MOSFET's", *IEEE Transactions On Electron Devices*, vol. 47, No. 7, pp. 1406-1415, Jul. 2000.

H. Yin, et al., "Strain relaxation of SiGe islands on complaint oxide", *Journal of Applied Physics*, vol. 91, No. 12, pp. 9716-9722, Jun. 15, 2002.

International Preliminary Report dated Sep. 14, 2006.

* cited by examiner

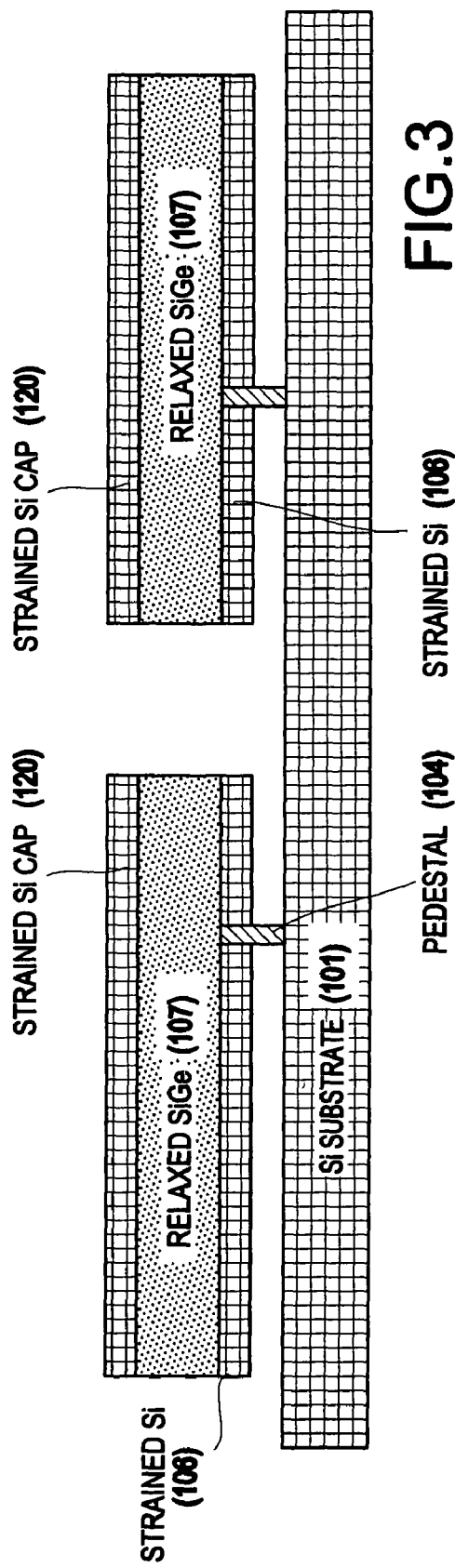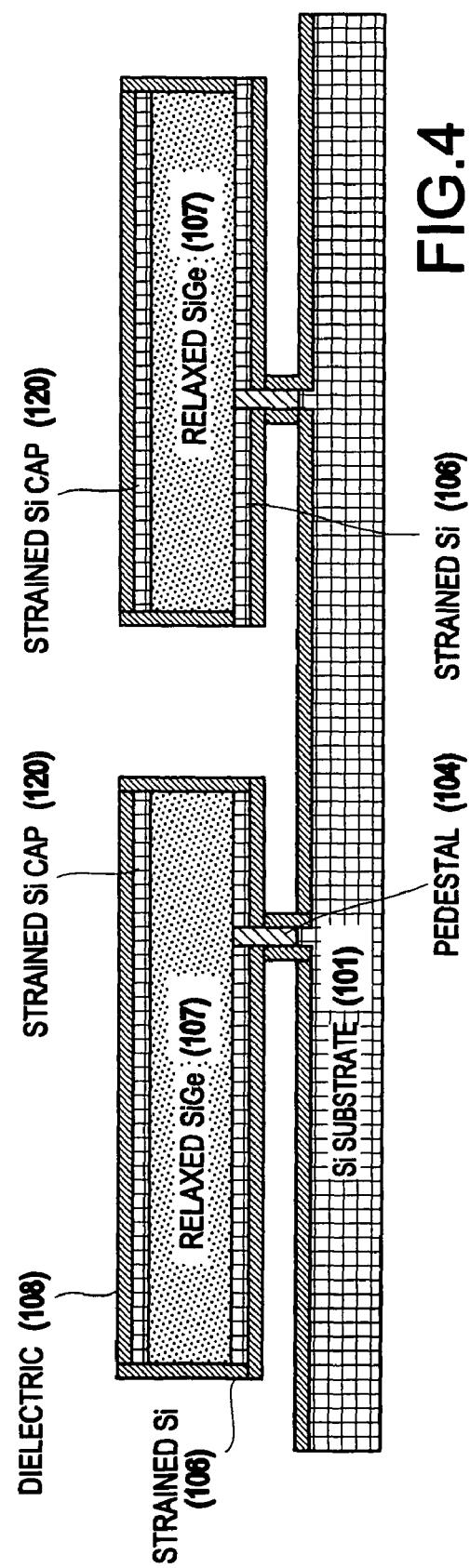

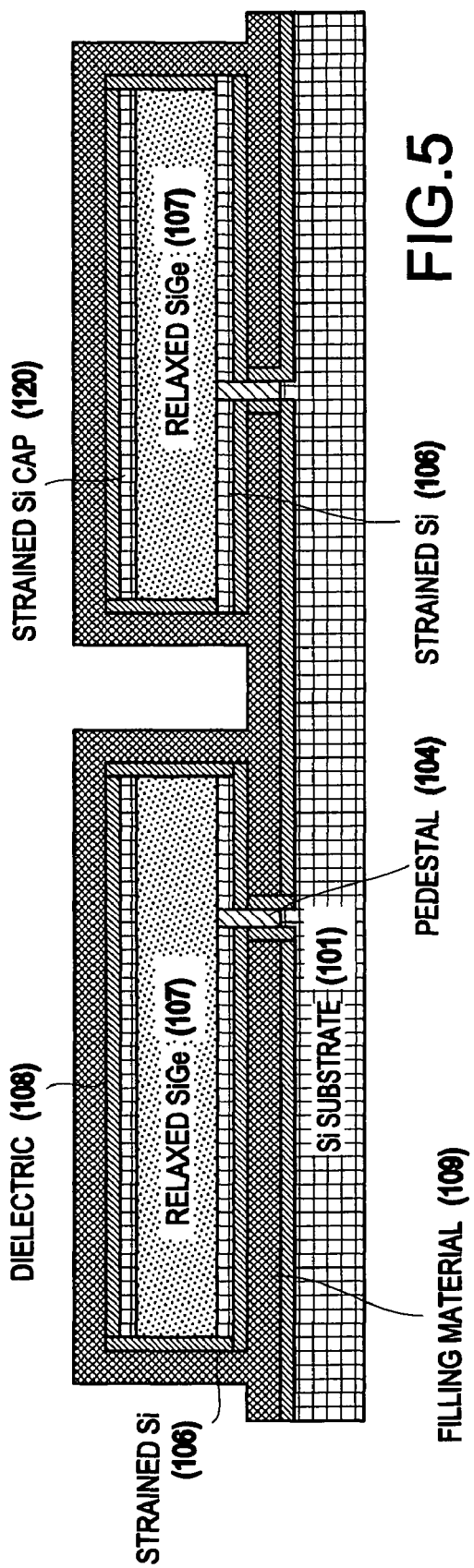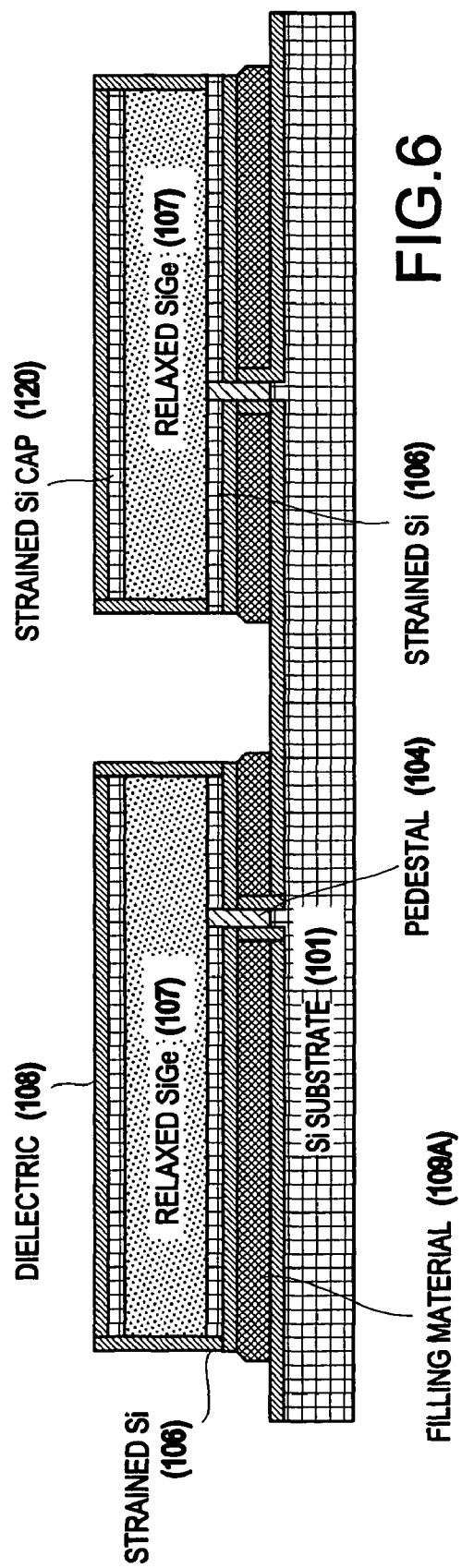

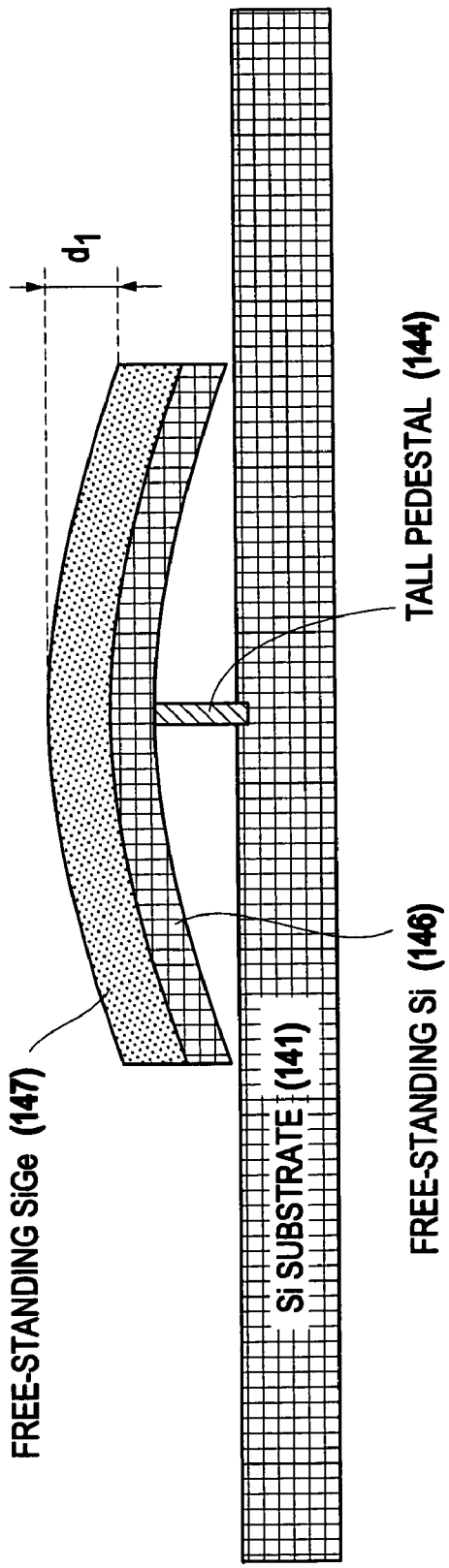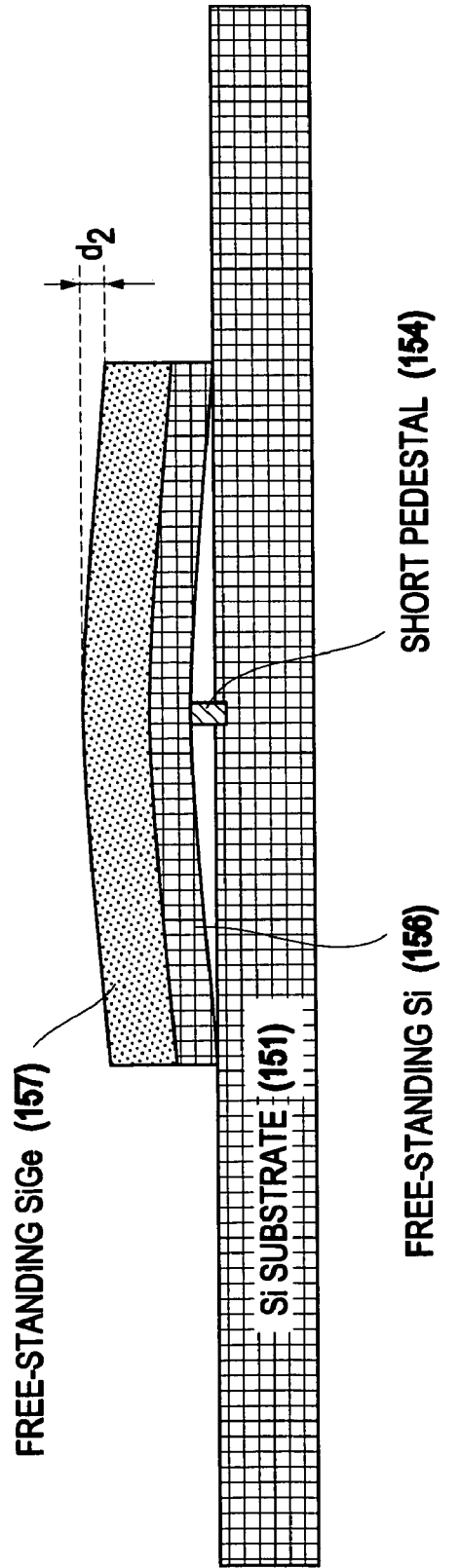

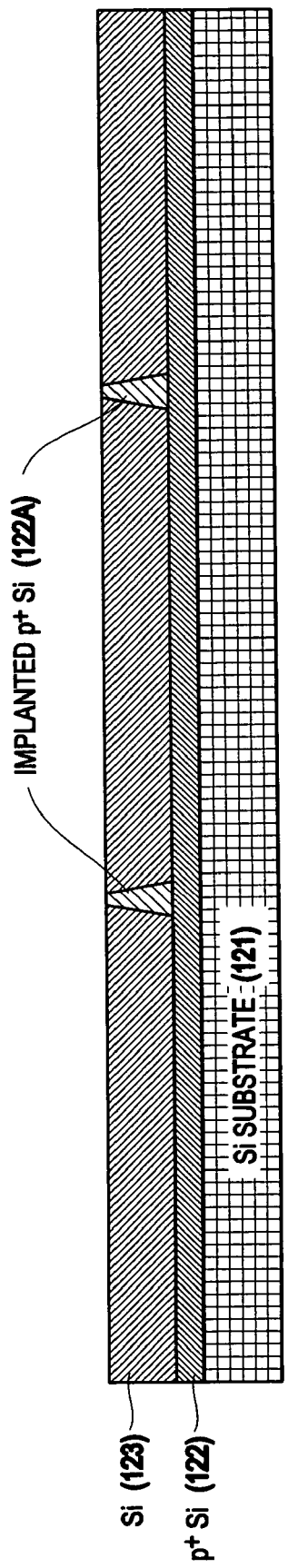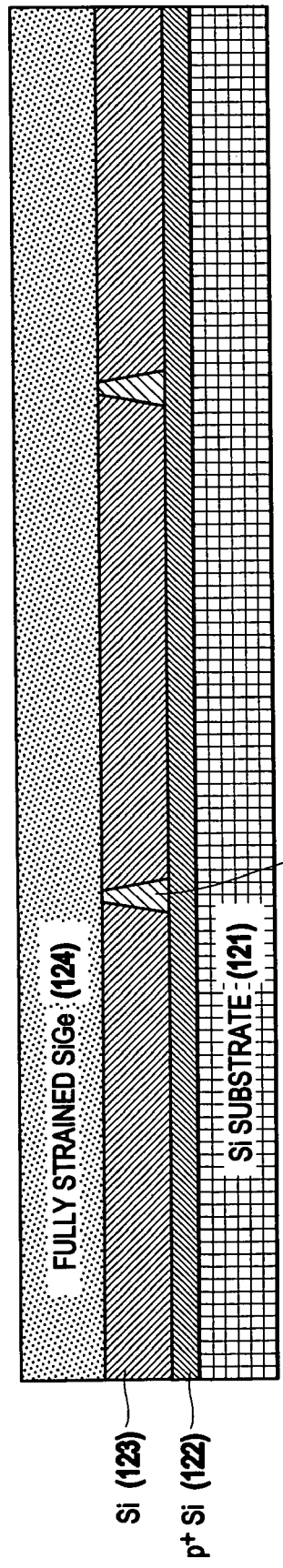

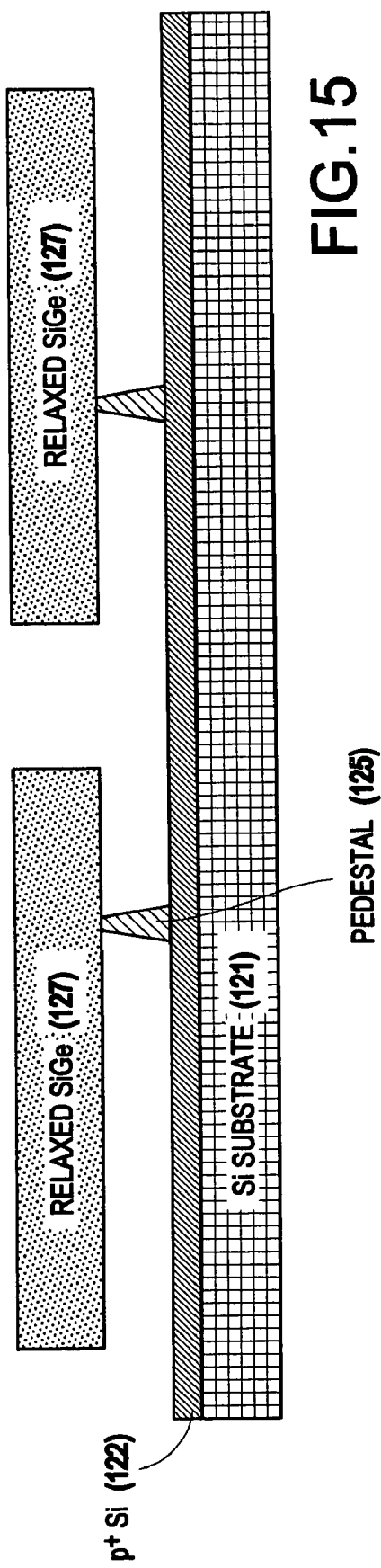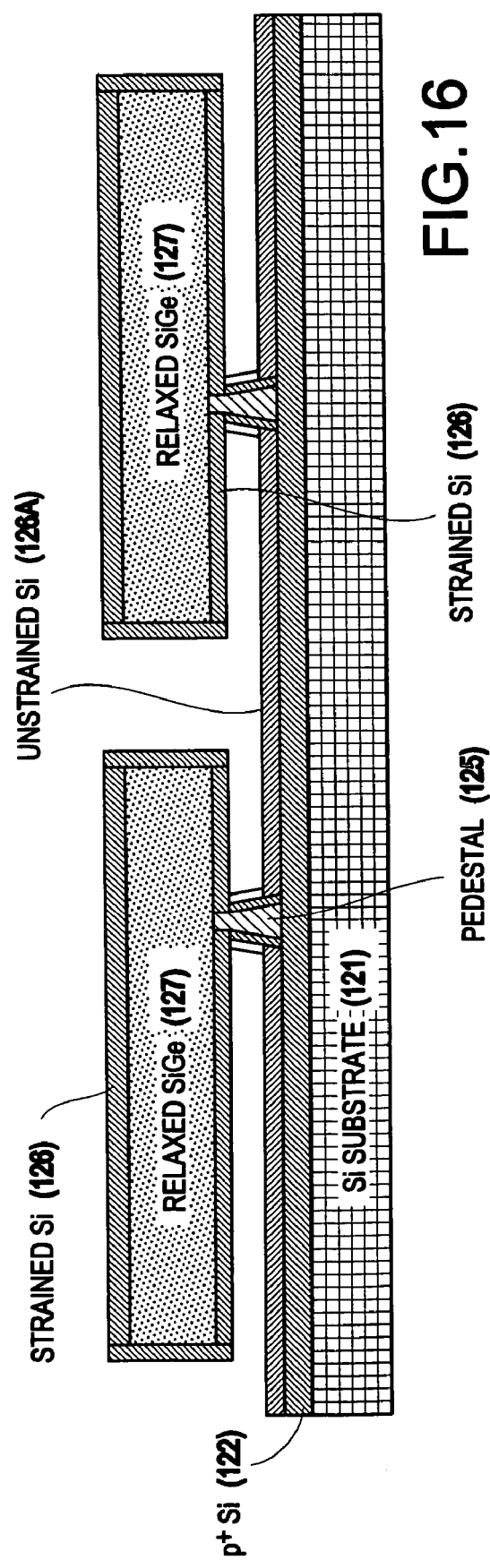

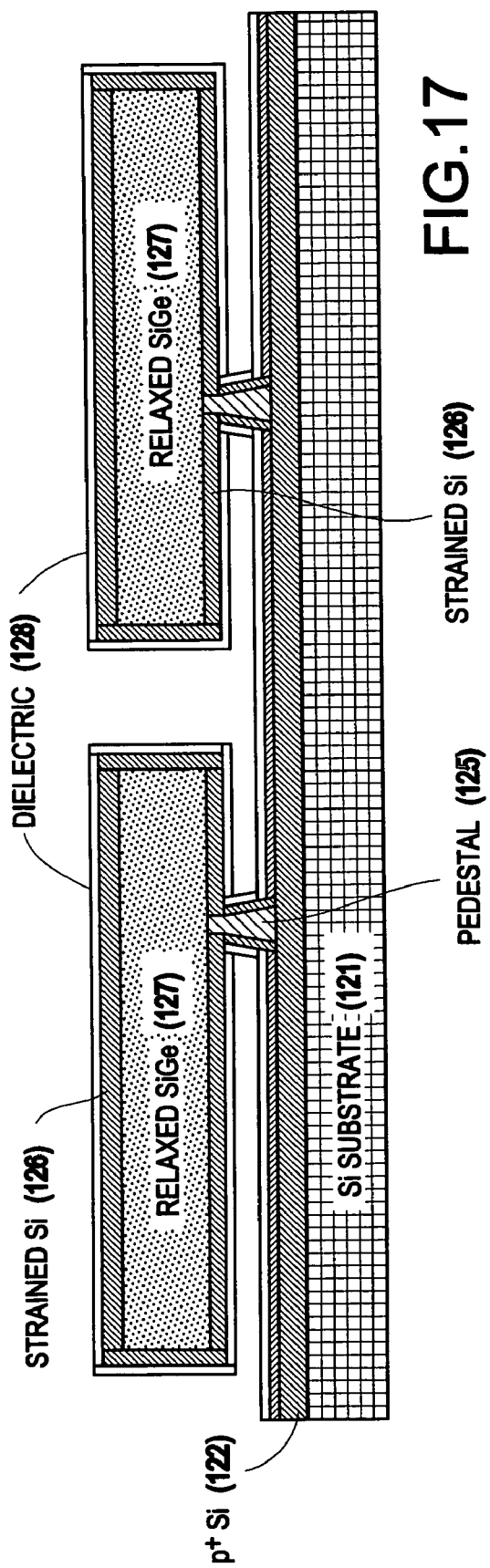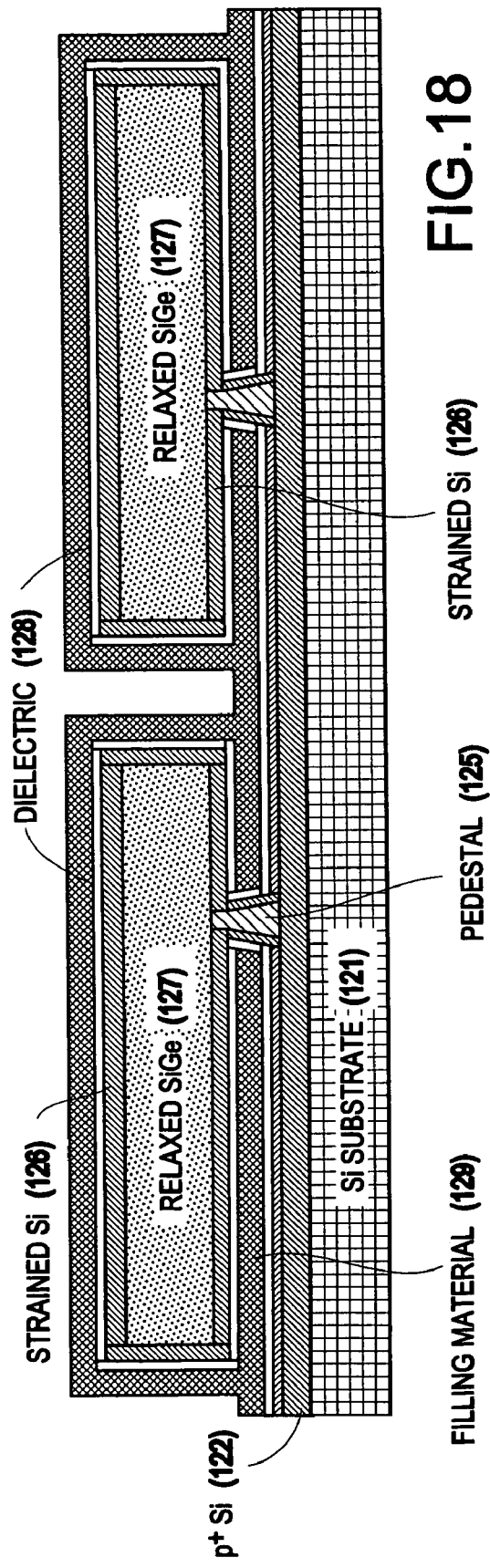

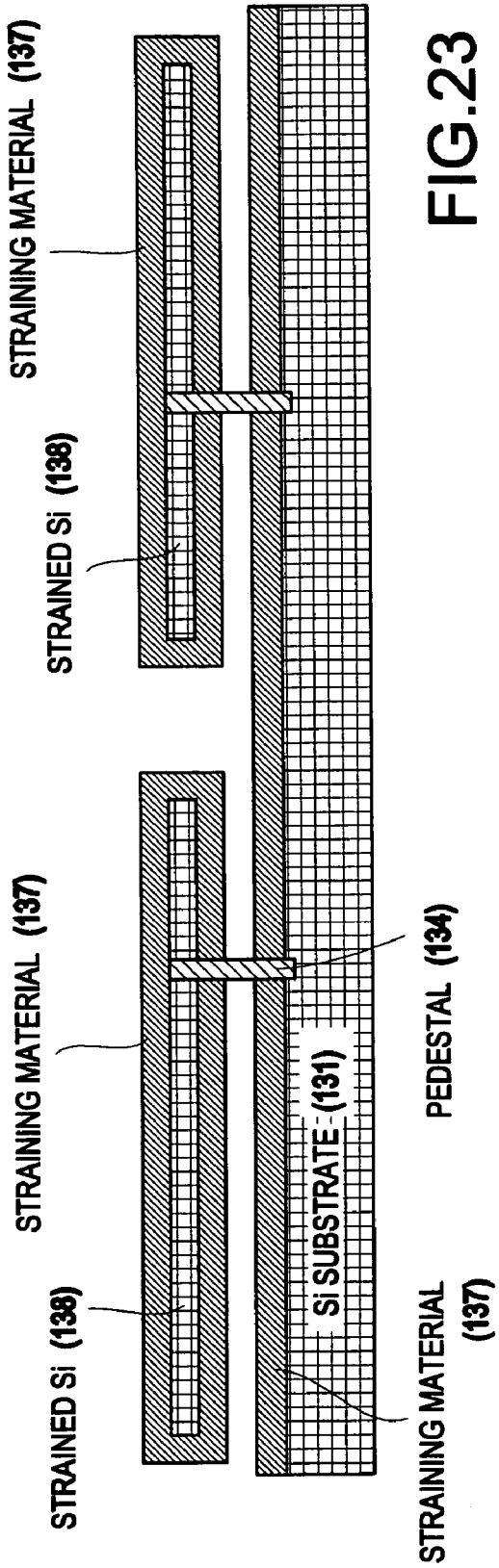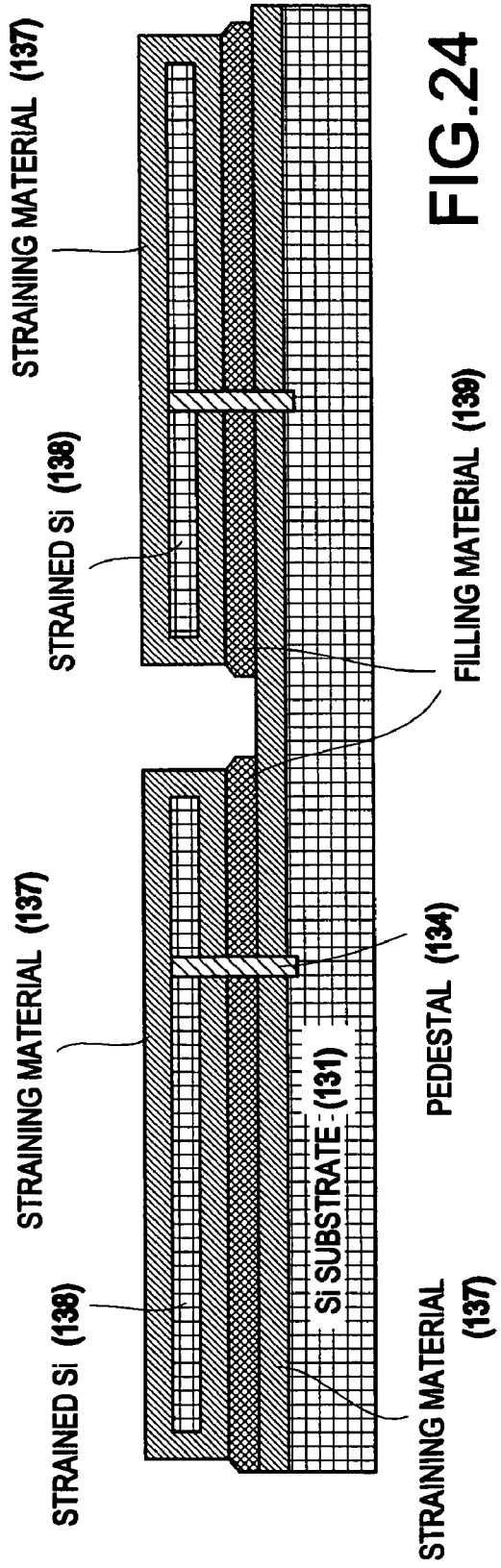

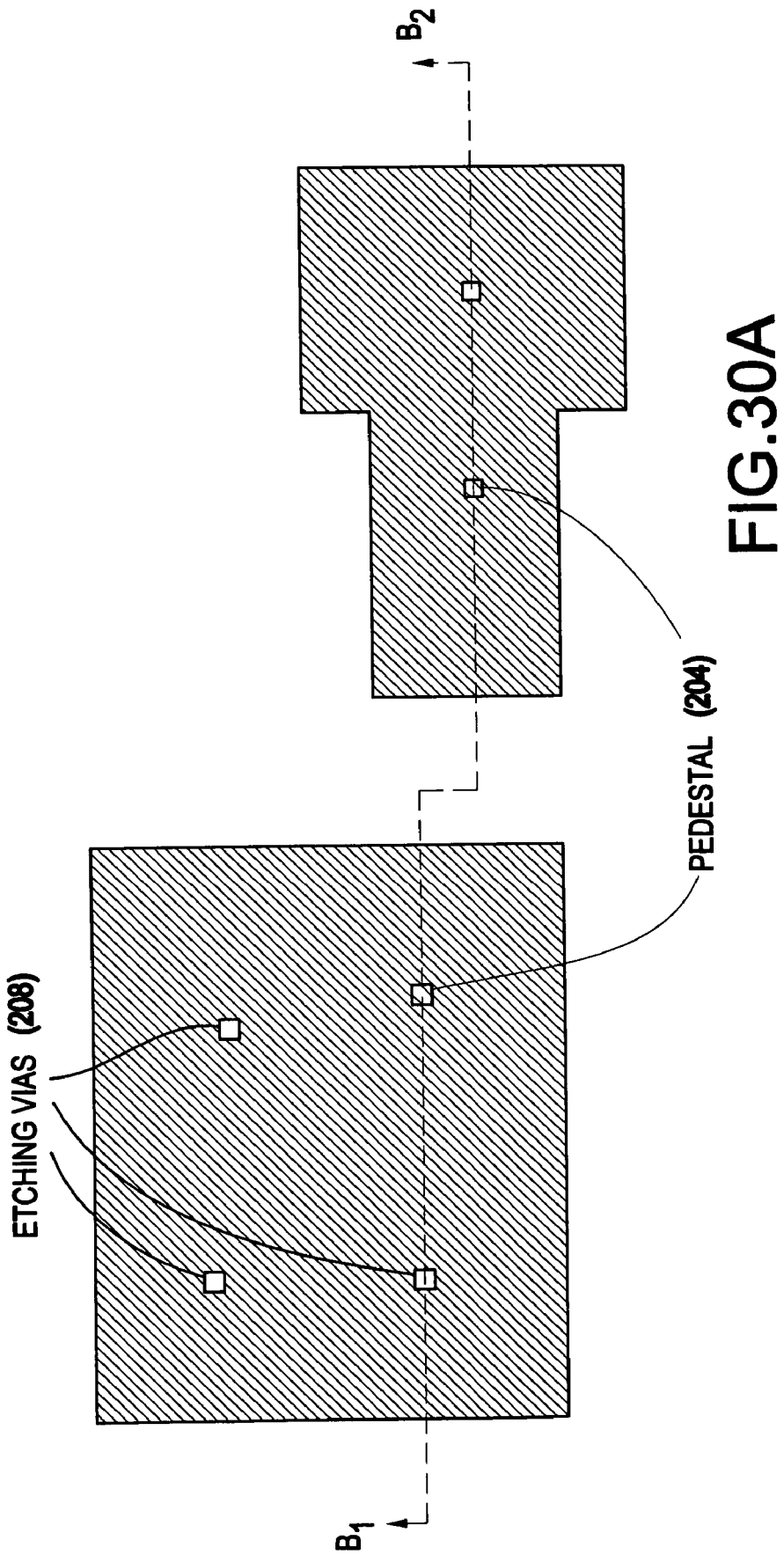

PARTIALLY RELAXED SiGe LAYER

FULLY STRAINED SiGe LAYER

STRAINED-SILICON-ON-INSULATOR SINGLE- AND DOUBLE-GATE MOSFET AND METHOD FOR FORMING THE SAME

BACKGROUND OF THE INVENTION

1. Field of the Invention

The present invention relates to a semiconductor device, and more particularly to a strained-silicon-on insulator MOSFET with a single or a double gate, and to a method of forming a strained-silicon-on-insulator structure.

2. Description of the Related Art

A MOSFET fabricated in 001-oriented silicon under biaxial tensile strain exhibits higher carrier mobilities than a conventional MOSFET (e.g., see K. Rim, J. L. Hoyt, J. F. Gibbons, "Fabrication and Analysis of Deep Submicron Strained-Si N-MOSFET's", EEE Trans. Electron Devices, 47(7), p. 1406, (2000)). The higher carrier mobility leads to a higher current drive and thus a faster/shorter switching time is obtained.

The "strained" silicon film is typically formed by growing an epitaxial silicon layer on top of a strain-relaxed, graded SiGe layer structure (e.g., see P. M. Mooney, Materials Science and Engineering Reports R17, p. 105 (1996) and references therein).

As known, Ge has a lattice constant which is approximately 4% larger than the lattice constant of Si, and the lattice constant of the alloy, $Si_{1-x}Ge_x$, increases approximately linearly with increasing Ge mole fraction, x, of the alloy. Since these semiconductors have cubic symmetry, the in-plane and out-of-plane lattice constants are equal in unstrained crystalline films or bulk crystals.

Herein, strained (or fully strained) means that the in-plane lattice constant of the SiGe layer, which is larger than that of the Si substrate, is compressed so that it matches that of the Si substrate (see FIG. 31A), resulting in a corresponding expansion of the out-of-plane lattice parameter such that the in-plane and out-of-plane lattice parameters of the SiGe layer are no longer equal. A SiGe layer is partially strained or partially relaxed when the in-plane lattice parameter is larger than that of Si, but still smaller than the out-of-plane SiGe lattice parameter. The SiGe is fully relaxed or unstrained when the in-plane and out-of-plane lattice parameters are equal. For Si under biaxial tensile strain (e.g., when it is grown epitaxially on a partially or fully relaxed SiGe layer), the in-plane lattice parameter is larger than the out-of-plane lattice parameter.

SUMMARY OF THE INVENTION

A thin SiGe layer grown epitaxially on a Si(001) substrate will be strained, with the in-plane lattice parameter matching that of the Si substrate. In contrast, when a thicker layer is grown, the strain will be relaxed by the introduction of dislocations, specifically 60° misfit dislocations when the lattice mismatch is <2%, as shown schematically in FIG. 31B. The thicker the layer, the more dislocations present and the more relaxed the SiGe layer is. The "misfit dislocation" is the boundary of a missing plane of atoms. It is typically a half loop, with a misfit segment running parallel to the SiGe/Si interface terminating in threading arms that go to the wafer surface, as shown in FIG. 31C. The presence of the misfit dislocation creates an atomic step at the wafer surface. Strain relaxation by the introduction of crystal defects is known as "plastic strain relaxation".

Plastic strain relaxation results in a rough surface that exhibits a cross-hatch pattern, which raises surface roughness/topography issues as described below, and a threading dislocation density in the range of $10^5$-$10^8$ $cm^{-2}$ in the upper part of the relaxed SiGe layer and the strained Si film. The strain fields from the misfit dislocation network introduce a so-called "mosaic structure" in the SiGe and Si layers, which is detected as a broadening of the x-ray rocking curve. Triple-axis x-ray diffraction measurements can distinguish mosaic broadening from other effects, such as a non-uniform SiGe lattice parameter or alloy composition, that can also cause a broadening of the x-ray rocking curve. The exact nature of the mosaic structure in the upper part of the SiGe film and the strained Si layer is determined by the arrangement of the misfit dislocations, which will vary depending on the SiGe layer structure and the epitaxial growth conditions used to fabricate the structure.

Another disadvantage is that a relatively thick (and thus relatively costly) SiGe epi-layer is needed.

Another disadvantage of the relaxed SiGe buffer layer technique is that it can only be used to make bulk devices. Bulk devices do not have advantages such as the reduction in the junction capacitance and elimination of the latch-up path between devices, that are obtained by silicon-on-insulator (SOI) devices (e.g., see J-P. Colinge, Siliocn-On-Insulator Technology: Materials to VLSI, 2nd Ed., Kluwer Academic Press, Boston, 1997).

A strained silicon-on-insulator technology with a tensile strained SOI film made directly on insulator is desired, since this combines the advantages of SOI technology with the mobility enhancement obtained in strained silicon.

In addition, issues related to the use of SiGe as the device substrate are eliminated. For example, the formation of cobalt disilicide at a higher temperature in SiGe than in pure silicon, and enhanced n-type dopant diffusion are major concerns in the fabrication of MOSFETs in strained Si on relaxed SiGe.

A strained silicon film over an insulator can be formed by wafer bonding and layer transfer. A wafer with a strained silicon film is implanted with hydrogen (e.g., a Smart-Cut™ process), and then flipped and bonded to a handle wafer having the insulator film. The joined wafers are annealed to strengthen the bond, and to obtain blistering and splitting at about the depth where the hydrogen was implanted.

Thus, the strained-silicon layer and a portion of the SiGe buffer layer are transferred to the handle wafer. The transferred portion of the SiGe buffer is etched selectively so that the transferred strained-silicon layer is left on the insulator. The fabrication of a strained-silicon-on-insulator (SSOI) by bonding is discussed in U.S. patent application Ser. Nos. 09/823,855, 09/895,579, and U.S. patent application Ser. No. 10/112,751.

While the wafer bonding technique discussed above may provide a way to obtain a strained-silicon layer on an insulator, it does not provide a method for straining the transferred silicon film, but relies on the conventional technique of growing the silicon film on a "plastically relaxed" SiGe layer.

The use of plastically relaxed SiGe as a template for growing strained silicon introduces problems such as large surface roughness and high defect concentration in the film. It also requires the lengthy growth of a thick SiGe buffer layer, as mentioned above.

In view of these issues, there are some major disadvantages to the fabrication of a strained-silicon-on-insulator by bonding and layer transfer including:

1. Presently, bonding and layer transfer are expensive and are relatively low yield processes.
2. A long chemical mechanical polishing (CMP) step is typically required due to the SiGe layer roughness (e.g., topographical issues). The roughness is a result of the crosshatch pattern that forms during the plastic relaxation of the SiGe layer.

3. The bonding strength may not be sufficient due to the use of a low bonding temperature. The lower bonding temperature is imposed to prevent Ge diffusion into silicon and to prevent relaxation of the strain silicon film.

4. A Smart-Cut™ process in which hydrogen is implanted into the SiGe buffer layer may be difficult to control since the hydrogen will partially relocate to defects in the SiGe film which are not at the intended blistering location.

Relaxation of SiGe can be obtained by transferring and bonding a layer of strained SiGe onto a wafer with a borophosphorosilicate glass (BPSG) film, patterning the film and then annealing the wafer at the temperature were the BPSG film reflows. (e.g. see H. Yin, R. Huang, K. D. Hobart, Z. Suo, T. S. Kuan, C. K. Inoki, S. R. Shieh, T. S. Duffy, F. J. Kub, J. C. Sturm, "Strain relaxation of SiGe islands on compliant oxide", J. Appl. Phys., 91(12), p. 9716, (2002)). This technique has the following disadvantages.

First, it also uses wafer bonding to transfer the SiGe film, and therefore has some of the problems discussed earlier. Second, the anneal at the BPSG reflow temperature leads to diffusion of boron and phosphorus from the glass into the SiGe film. This is an undesirable effect since both boron and phosphorus are dopants of silicon and SiGe. Third, some of the strain in the film relaxes by buckling of the SiGe film. This leads to an undulated rough surface.

Thus, prior to the present invention, there has been no technique which eliminates the difficulties inherent in the current methods by teaching away from wafer bonding and by using "elastic relaxation" of the SiGe layer (e.g., which occurs without the introduction of defects and roughness in contrast to plastic relaxation which is used by current methods).

Additionally, hitherto the present invention, there has been no technique which provides a method for forming a strained silicon layer on a thin insulator over a conductor, which creates a starting substrate for making a strained-silicon channel double-gate MOSFET.

In view of the foregoing and other problems, drawbacks, and disadvantages of the conventional methods and structures, an exemplary feature of the present invention is to provide a method (and resulting structure) for forming a novel strained-silicon-on insulator MOSFET with a single or a double gate, and to a method of forming a novel strained-silicon-on-insulator structure.

An exemplary, non-limiting technique of the present invention eliminates the difficulties inherent in the conventional methods, by teaching away from wafer bonding and by using elastic relaxation of the SiGe layer (e.g., which occurs without the introduction of defects in contrast to plastic relaxation which is used by conventional methods).

An exemplary, non-limiting technique of the present invention also provides a method for forming a strained silicon layer on a thin insulator over a conductor, which creates a starting substrate for making a strained-silicon channel double-gate MOSFET.

In a first exemplary, non-limiting aspect of the present invention, a method of forming a semiconductor structure (and the resulting structure), includes straining a free-standing semiconductor layer, and fixing the strained, free-standing semiconductor layer to a substrate.

Exemplarily, a method is provided for forming a strained-silicon film which is strained by an elastically relaxed SiGe film. The SiGe film is preferably deposited pseudomorphically (i.e., fully strained) on a thin SOI film. The SiGe film then preferably relaxes elastically (e.g., without defect formation) when the supporting buried oxide layer is removed by etching, except from a single contact point. This results in a free-standing film stack including a silicon layer and a SiGe layer. The Si and SiGe layers preferably will share the lattice mismatch strain. If the SiGe film is made much thicker than the silicon layer, then the SiGe film will be close to fully relaxed (i.e., nearly strain-free). The area of the free-standing film and the location of its supporting pedestal are typically determined by circuit design ground rules. In a non-limiting, exemplary technique, the pedestal can be fabricated by drilling a cavity through the SOI film and filling the cavity with a material that is not etched by the buried oxide etchant. The formation of the pedestal can be performed either before or after the deposition of the SiGe film, or before or after deposition of a silicon cap.

Additionally, it is noted that bowing of the free-standing structure may be prevented by sandwiching the SiGe film between two silicon films of equal thicknesses. Alternatively, in another exemplary aspect, bowing can be reduced by suitably adjusting the height of the pedestal such that instead of a relaxed SiGe with strained silicon on first and second sides, a first side of the strained silicon is removed and the height of the pedestal is reduced. Thus, exemplarily, a bilayer can be used and bowing can be reduced in a controlled fashion by using a very short pedestal to support the free-standing film. Thus, this exemplary technique is one way of eliminating one of the strained silicon layers on a side of the relaxed SiGe, and yet minimizes (or prevents) the problem of bowing.

In a second exemplary, non-limiting aspect of the present invention, a semiconductor substrate, includes a substrate, a free-standing structure comprising a strained silicon film, a first dielectric film formed on the substrate and on the free-standing structure, and a filling material formed between the free-standing structure and the substrate. The filling material attaches the free-standing structure to the substrate.

Exemplarily, a semiconductor substrate may include a strained silicon film formed on top of an insulator. Following the fabrication of the free-standing silicon and SiGe films described above, the strain state of the silicon film is fixed by deposition of a filler material which is rigidly attached to both the thin strained Si layer and the Si substrate. The filler material is subsequently removed by dry etching, except from where it is protected by the Si/SiGe film stack. The SiGe film is then etched off selectively leaving behind a strained Si film on an insulator.

In a third non-limiting, exemplary aspect of the present invention, a strained silicon film is formed over an insulator without the use of a silicon-on-insulator starting wafer. A buried doped silicon film (e.g., p+ doped in a non-limiting structure; obviously the invention is not limited to this conductivity scheme as would be clearly known by one of ordinary skill in the art taking the present application as a whole) and a doped pedestal are used to define, by selective etching, a relaxed free standing SiGe film on a pedestal.

In this exemplary method, first, a film stack including a p+ doped silicon film and an undoped silicon layer are grown by epitaxy. The buried doped silicon film can be realized, for example, by in-situ doping during silicon epitaxy or by a dopant implant. Then, a p+ doped pedestal is formed by a masked dopant implantation that defines a doped region with a base in the buried doped silicon film and a top that reaches the undoped silicon surface. Thereafter, a blanket pseudomorphic SiGe layer is preferably deposited over the undoped silicon film and the p+ doped pedestal. The SiGe layer is patterned and the undoped silicon is selectively etched leaving a relaxed free standing SiGe film on a pedestal. A strained-silicon film is then preferably epitaxially grown on all sides of the free-standing SiGe film. Preferably, a filler material is used to fix the strained-silicon film on the bottom face of the SiGe layer to the substrate. The filler material is removed, except from where it is protected by the free standing film. The top silicon and SiGe films preferably are then etched off selectively.

In a fourth non-limiting, exemplary aspect of the present invention, a single-gate strained-silicon channel MOSFET is formed over the strained-silicon-on-insulator region.

In a fifth non-limiting, exemplary aspect of the present invention, a single-gate strained-silicon channel MOSFET with a backside gate for threshold control is formed over the strained-silicon-on-insulator. A gate insulator preferably is deposited over the bottom face of the strained-silicon film and a conductive filler material preferably is used to fabricate a bottom gate. The MOSFET threshold may be adjusted via a bottom gate contact.

In a sixth non-limiting, exemplary aspect of the present invention, a semiconductor device includes a strained-silicon channel formed adjacent a source and a drain, a first gate formed on a first side of the channel, a second gate formed on a second side of the channel, a first gate dielectric formed between the first gate and the strained silicon channel, and a second gate dielectric formed between the second gate and the strained silicon channel.

Exemplarily, a planar double-gate strained-silicon channel MOSFET is disclosed, in which preferably first (e.g., top) and second (e.g., bottom) gates can be controlled independently. The top and bottom gate materials can be different. Additionally, the top gate dielectric can be of different material and film thickness than the bottom gate dielectric. Different schemes for alignment of the two gates can be used. A good processing scheme would be the one practiced with a conventional device in which the two gates are self-aligned (e.g., see P. M. Solomon, K. W. Guarini, Y. Zhang, K. K. Chan, E. C. Jones, G. M. Cohen, A. Krasnoperova, Maria Ronay, O. Dokumaci, H. J. Hovel, J. J. Bucchignano, C. Cabral Jr., C. Lavoie, V. Ku, D. C. Boyd, K. S. Petrarca, I. V. Babich, J. Treichler, P. M. Kozlowski, J. S. Newbury, C. P. D'Emic, R. M. Sicina, J. Benedict and H.-S. P. Wong, "Two Gates Are Better Than One—A planar self-aligned double-gate MOSFET technology to achieve the best on/off switching ratio as gate length shrink", IEEE Circuits & Devices, 19(1), p. 48, 2003).

In a seventh non-limiting, exemplary aspect of the invention the relaxed SiGe film used for straining the silicon film is replaced with another material (such as silicon nitride) for straining the silicon film. Depending on the material choice, the silicon film can be under either tensile or compressive strain.

In an eighth non-limiting, exemplary aspect of the present invention, a circuit layout is preferably segmented into sub-areas which define where a free-standing film area will be fabricated. In each sub-area, the location of a single supporting pedestal is determined. The segmentation to free-standing areas and allocation of the pedestal are based on circuit design rules and can be performed automatically by a computer program.

In a ninth non-limiting, exemplary aspect of the present invention, a monolithic circuit preferably contains mixed technology MOSFET devices such as bulk-CMOS, bulk strained-silicon CMOS, and SOI-CMOS and strained-SOI CMOS.

With the unique and unobvious combination of features of the present invention, an exemplary method (and resulting structure) are provided for forming a novel strained-silicon-on insulator MOSFET with a single or a double gate, and to a method of forming a novel strained-silicon-on-insulator structure. Additionally, the exemplary, non-limiting technique of the present invention eliminates the difficulties inherent in the conventional methods, by teaching away from wafer bonding and by using elastic relaxation of the SiGe layer (e.g., which occurs without the introduction of defects in contrast to plastic relaxation which is used by conventional methods). Further, the invention provides a method for forming a strained silicon layer on a thin insulator over a conductor, which creates a starting substrate for making a strained-silicon channel double-gate MOSFET.

BRIEF DESCRIPTION OF THE DRAWINGS

The foregoing and other exemplary features, purposes, aspects and advantages will be better understood from the following detailed description of exemplary embodiments of the invention with reference to the drawings, in which:

FIG. 3 illustrates a free-standing structure including a relaxed SiGe film 107, strained silicon films 106 and 120, and a pedestal 104;

FIG. 4 illustrates the structure after the conformal deposition of a dielectric film 108;

FIG. 5 illustrates the structure after deposition of a filling material 109;

FIG. 6 illustrates the structure after etching of the filling material 109 and in which the filling material under the free-standing film 109A is unetched;

FIGS. 11-12 illustrate an amount of bowing obtained for a tall and a short pedestal;

FIGS. 13-20 illustrate another embodiment of the present invention;

FIGS. 21-25 illustrate another embodiment according to the present invention;

FIG. 26 illustrates a monolithic circuit made with strained channel SOI MOSFETs and with conventional SOI MOSFETs; and FIG. 27 illustrates a monolithic circuit made with strained channel SOI MOSFETs and with conventional bulk MOSFETs;

FIGS. 30A and 30B are a top view and a cross-sectional view, respectively illustrating the use of etching vias 208 as a method for accelerating the etching of the BOX under large free-standing areas;

DETAILED DESCRIPTION OF EXEMPLARY EMBODIMENTS OF THE INVENTION

Figure 1:
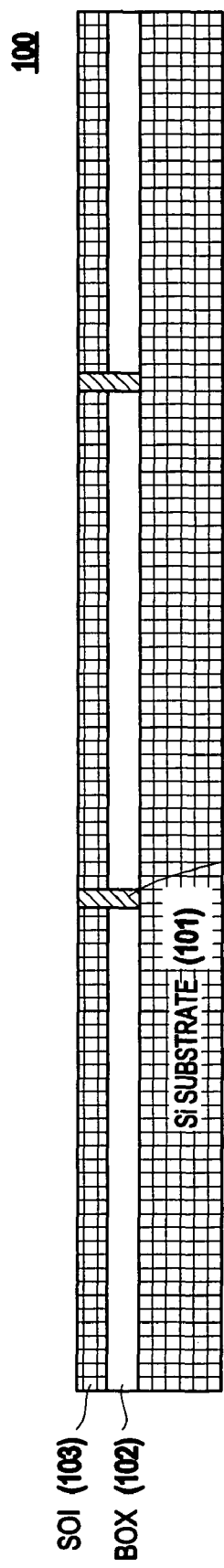
FIG. 1 illustrates a cross-sectional schematic of a silicon-on-insulator (SOI) wafer with etched and refilled pillars/pedestals 104.

Referring now to the drawings, and more particularly to FIGS. 1-30B, there are shown exemplary embodiments of the method and structures according to the present invention.

FIG. 1 shows an SOI substrate 100 including a substrate 101, such as a silicon substrate, a buried oxide (BOX) layer 102, and a SOI layer 103. The SOI substrate 100 is typically fabricated by conventional methods such as wafer bonding or separation by implanted oxygen (SIMOX).

At predetermined locations, cavities are etched through the SOI film 3 and the BOX 2. The cavities are filled with a material (which will form pedestals 104) such as silicon, silicon-nitride, or any other material that is not etched by the etchant later used to etch the BOX 102. Thus, a so-called "drill and fill" operation is conducted, to form the pedestals 104. If the SOI film 103 must be isolated from the substrate 101, then material 104 is preferably chosen to be an insulating material. The SOI film 103 is a relatively thin layer, and may have a thickness in a range of about 50 Å to about 300 Å. Obviously, the invention is not limited to such a thickness range.

Figure 2:
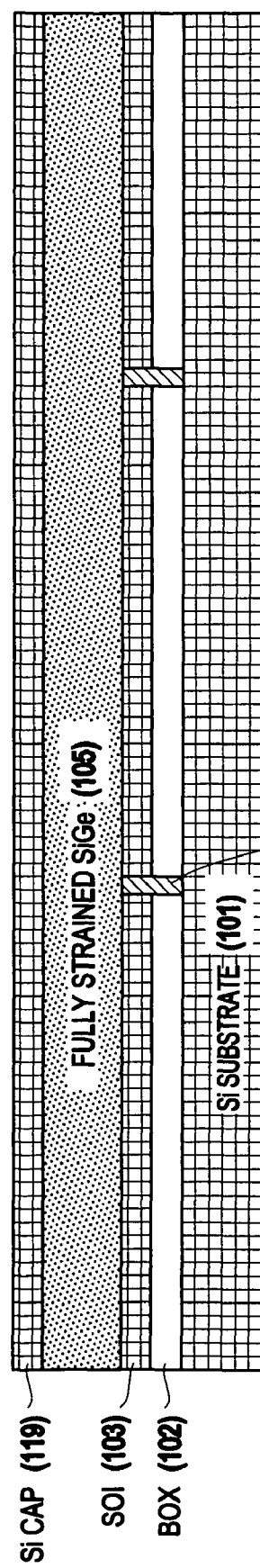
FIG. 2 illustrates the structure after epitaxy of a SiGe film 105 and a Si cap 119.

Thereafter, a fully strained SiGe layer 105 is epitaxially grown on top of the SOI film 103, as shown in FIG. 2. The fact that the SiGe layer 105 is "fully strained" means that layer 105 has substantially no defects/dislocations. While it is recognized that a "strained" structure may have some incidental, minute number of defects, "substantially defect-free", for purposes of the present application, means that the threading dislocation density in the strained silicon may be on the order of about zero to about $10^4$ cm$^{-2}$.

It is noted that "strained" silicon means that its cubic lattice constant is elongated in one dimension and narrower in another dimension, and thus has lost its cubic symmetry. Hence, "strained silicon" has a unit cell which is distorted. This distortion can be measured by high-resolution x-ray diffraction, which measures the lattice constants of crystalline materials.

The SiGe layer 105 may have a desired thickness depending upon the composition of the SiGe, possibly up to 12,000 Å. For example, building a SiGe layer having 20% Ge may result in a SiGe layer having a thickness on the order of about 3500 Å. However, as would be known by one of ordinary skill in the art taking the present application as a whole, the thickness of the SiGe layer 105 may depend on many factors including the composition, growth techniques, temperature, etc.

Thereafter, a silicon cap layer 119 having a thickness preferably substantially/approximately equal to that of the SOI film 103 is epitaxially grown on the SiGe film 105. Similarly to the SOI layer 103, the silicon cap layer 119 is typically relatively thin and may have a thickness on the order of about 50 Å to about 300 Å. Again, the present invention is certainly not limited to such an exemplary range of thicknesses.

It is noted that both the silicon cap layer 119 and the SOI layer 103 are both "relaxed" silicon (e.g., meaning that they have the lattice constant of a bulk silicon substrate). Although the silicon cap 119 is grown on the fully strained SiGe layer 105, the silicon cap layer is not strained. The reason that the SiGe is "strained" is that it has adapted to the template of the silicon lattice constant, and thus, to everything grown on top of the SiGe, it appears as silicon. However, again, both the silicon cap layer and SOI layer are not strained.

Thereafter, the Si cap 119, the SiGe film 105 and the SOI film 103 are patterned by lithography and reactive ion etching (RIE) into sub-regions.

Using a wet etch such as hydrofluoric acid (HF) or the like, the BOX 102 is etched. However, the pedestal 104 is not etched, but is allowed to remain. The removal of the BOX 102 forms a free-standing structure comprising a strained Si film 106, a strained silicon cap 120, and a relaxed SiGe 107, as shown in FIG. 3. It is a free-standing structure since it is held only at one very small area by the pedestal 104. As a result, the free-standing structure is free to expand, whereas, prior to the etching, the SiGe layer 105 was forced to remain strained, since no layer could move in the plane of the wafer. That is, the SiGe layer 105 was rigidly held by the SOI layer 103, which was firmly held by BOX 102, which in turn was firmly held by the substrate.

It is noted that the position of the pedestal 104 is not limited to any particular area, so long as it is somewhere under the free-standing structure. Thus, the pedestal need not be under the center of the free-standing structure, but can be offset from the center (e.g., as shown exemplarily in FIG. 3) or can be placed at or near an edge of the free-standing structure.

Preferably, there is only a single pedestal 104 provided. One pedestal will result in the SiGe film being allowed to stretch freely.

In contrast, if a plurality of pedestals 104 (e.g., two, or more) were provided under the free-standing structure, there would be a plurality (e.g., two or more) of points of confinement, and the SiGe would have to stretch between these two (or more) confinement points, thereby constraining the SiGe film. Hence, such a structure with two or more pedestals would result in a structure resembling a suspended bridge structure in which the SiGe would be somewhat constrained in its stretching to accommodate the lattice constant. Thus, there would be some bowing in such a structure. Hence, a single pedestal is preferable and can be freely placed wherever the designer desires.

Additionally, the timing of making the pedestal can be varied. That is, while it is noted in FIG. 1 that the BOX layer 102 and SOI layer 103 are formed and then drilled through to form the pedestal 104, and then the SiGe layer 105 is formed thereover, it is possible to first form the BOX 102, SOI 103, the SiGe layer 105, and even the silicon cap 119, and then form the pedestal 104 therethrough. This may be important when the pedestal is, for example, not made of silicon (e.g., pedestal 104 could be made of silicon nitride). Specifically, in the case of a nitride pedestal, when the SiGe is grown, it will not grow over the pedestal 104, which may not be problematic, but which will make the structure appear different. Thus, if for some reason this formation becomes an issue, then the pedestal could be formed later (e.g., after the processing of FIG. 2 and more specifically after the formation of the BOX, SOI, SiGe, and the silicon cap).

Returning to FIG. 3, hence, the strain in the relatively thick SiGe film 105 capped by the silicon layer 119 and the silicon (SOI) 103 below is reduced, since the strained SiGe film 105 is no longer being held by the substrate 101 and the BOX 102 (e.g., except again for a single contact point where it is held by the pedestal 104).

As the compressive strain in the SiGe film 105 is reduced to form relaxed SiGe layer 107, the strain is transferred to the SOI film 103 and the silicon cap 119 which are under tensile strain.

The strain sharing between the relaxed SiGe film 107 and the strained silicon films 106 and 120 depends on the thickness ratio, $t_{SiGe}/t_{Si}$, where $t_{SiGe}$ is the SiGe film 107 thickness and $t_{Si}$ is the total thicknesses of the strained silicon films 106 and 120.

If the SiGe film 107 is made much thicker than silicon films 106 and 120 (i.e. $t_{SiGe} \gg t_{Si}$), then the compressive strain in the SiGe film 107 will be small, and the tensile strain in the two Si films will be correspondingly large. Typically, the relation $t_{SiGe} \gg t_{Si}$ is satisfied when $t_{SiGe}/t_{Si}$ is about 10 (at a ratio of 10 the residual strain in the SiGe film is 8% of the initial strain). Thus, again, since the lattice constant of the relaxed SiGe is essentially larger than that of silicon, the SiGe layer will stretch out and the bottom of the free-standing structure will be slightly longer than it was before. The upper and lower silicon films 119 and 103 will become strained because the lattice constant of these silicon films 119 and 103 will accommodate itself to the relaxed SiGe 107, thereby to become strained films 120 and 106.

As will become more evident below, preferably the relaxed SiGe layer 107 has first and second sides with a silicon film thereon, thereby to prevent bowing of the relaxed SiGe layer 107. However, the invention is not limited to such a structure, and indeed silicon may be provided on only one side of the relaxed SiGe 107.

Thus, as shown in FIG. 3, there is an "elastic relaxation" of the SiGe layer 107, meaning that there are substantially no defects formed in obtaining this relaxation. This is in contrast to the conventional techniques in which "plastic relaxation" occurs in which defects are formed, and in which even if the substrate were to be removed, the SiGe layer would still contain these defects. The SiGe layer 107 of the invention is substantially defect-free, and is well within the elastic deformation range.

Thereafter, as shown in FIG. 4, a dielectric film 108, such as $SiO_2$, is conformally deposited over the free-standing structure and the substrate.

Then, in FIG. 5, a filling material 109, such as poly-silicon or silicon-nitride, is conformally deposited so that it fills the space under the free-standing structure. The filling material 109 is for holding and maintaining the free-standing structure in its current state, and specifically maintaining the strained state of the Si 106 layer. Thus, the gap which had been previously held by the BOX 102, is now filled with the filling material 109 for rigidly and firmly holding the free-standing structure.

In FIG. 6, the filling material 109 is etched selectively by reactive ion etching (RIE). For example, assuming the filling material 109 is poly-silicon and the dielectric film 108 is $SiO_2$, an HBr based chemistry or the like can be used to etch selectively poly-silicon with respect to $SiO_2$. A portion of the filling material 109A is left unetched by RIE where it is shadowed by the free-standing film structure, as shown in FIG. 6. Thus, the filling material 109 is etched everywhere except where it is rigidly holding the relaxed and strained silicon films (e.g., underneath the free-standing structure).

Exposed portions of the dielectric film 108 are etched selectively (e.g., by a wet hydrofluoric acid etch).

Figure 7:
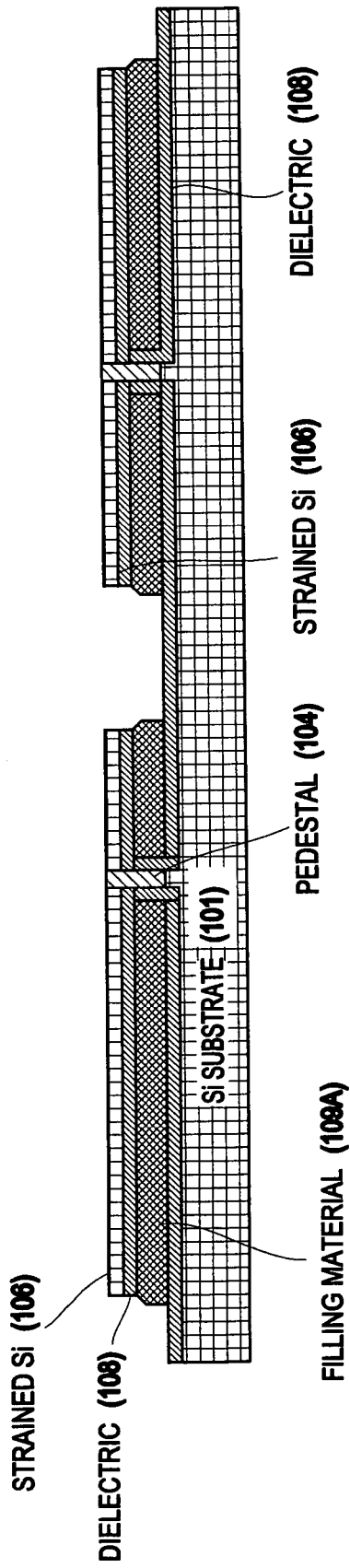
FIG. 7 illustrates the structure after removal of an exposed portion of the dielectric film 108, etching of the strained Si film 120 and the SiGe film 107. This structure includes a strained silicon film 106 over an insulator 108 which is attached by the filling material 109A to the substrate 101.

Then, the strained silicon cap 120 is etched off via RIE, and the relaxed SiGe film 107 is then etched selectively with respect to the strained silicon film 106, as shown in FIG. 7. An example of a SiGe selective wet etch is 1 $HF:2H_2O_2$: $3CH_3COOH$. The silicon film 106 remains strained after the SiGe layer 107 is removed since it is firmly held by the rigid filling material 109A.

Thus, as shown in FIG. 7, there is a substantially defect-free, strained silicon layer formed on an insulator.

Figure 8:
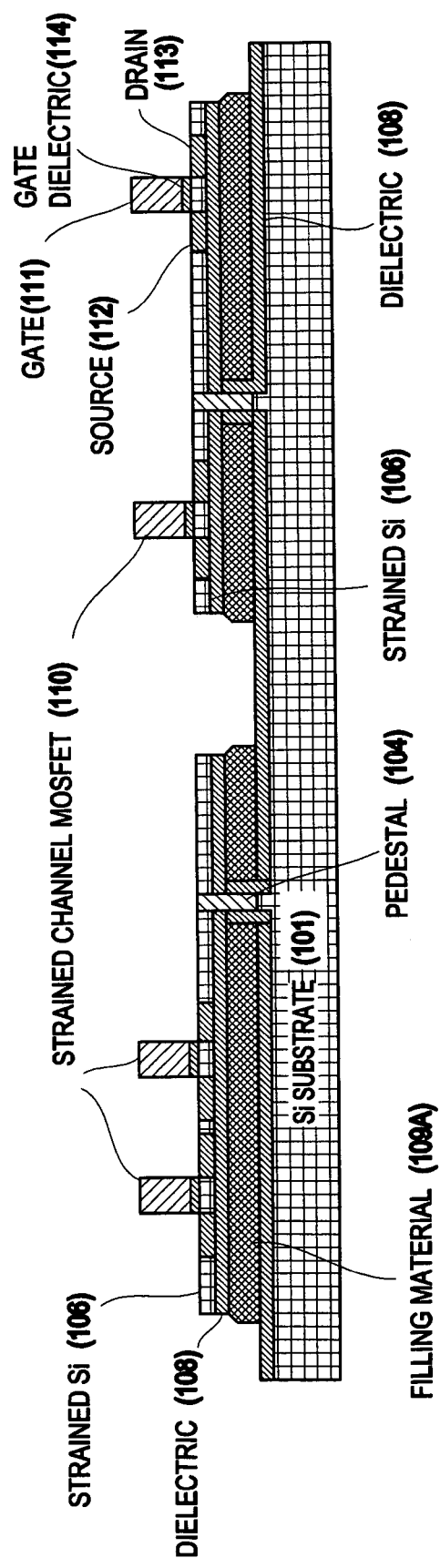
FIG. 8 illustrates a MOSFET device on a strained-silicon-on-insulator.

FIG. 8 illustrates that a device such as a strained-channel MOSFET device 110 including a gate 111, a source 112, a drain 113, and a gate dielectric 114, can be fabricated on the strained-silicon film 106.

It is noted that the filling material 109 and the dielectric film 108 can be advantageously chosen such that a backside-gate to the device is realized.

Indeed, the filling material could be selected to be a conductive backgate material, etc., and the dielectric film 108 could be selected to be a gate dielectric.

Figure 9:
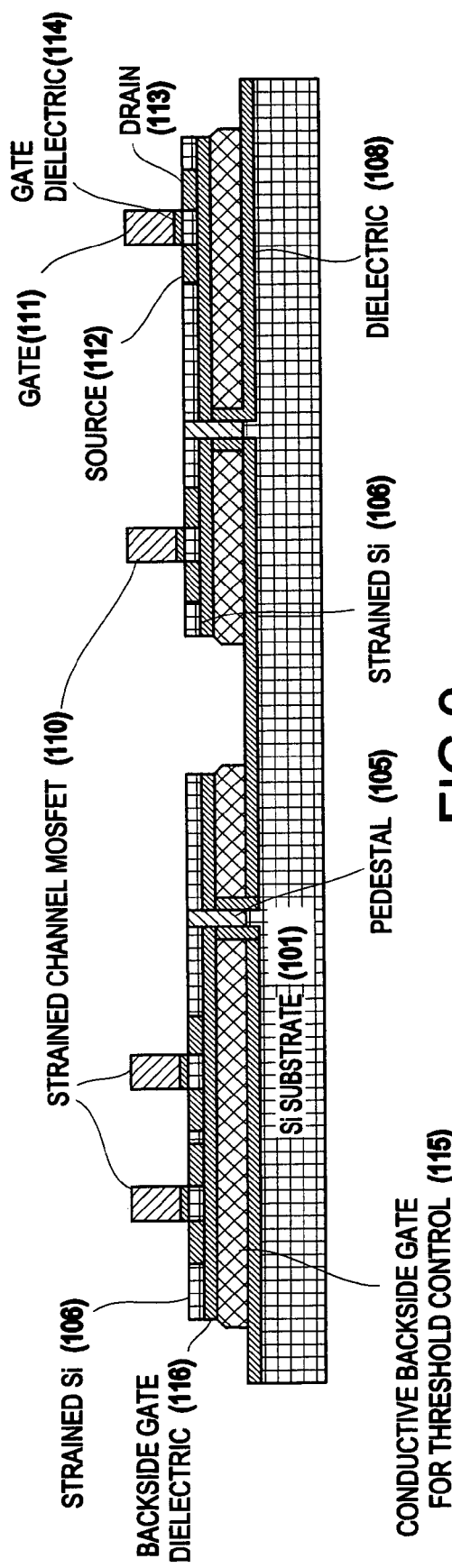
FIG. 9 illustrates a MOSFET device on a strained-silicon-on-insulator with a common backside gate.

Specifically, FIG. 9 shows a structure where a backside gate dielectric 116 and a conductive backside gate filling material 115 form a backgate to the strained-channel MOSFET device 110. This relatively large backside gate can be used to control a threshold voltage (Vt) of the device (or of a group of devices). The threshold voltage control is especially useful for the design of low power circuits. Specifically, one of the largest constraints in designing circuits is that today's devices may have a relatively high off-current when their Vt is low, and thus consume a large amount of power even when the devices are "off". Hence, one way to mitigate such a constraint is to turn off part of the circuit by shifting their Vt. To perform such an operation, one way to turn off part of the circuit is by having a backgate which shifts the Vt.

Thus, such circuits can be formed utilizing the structure of the present invention.

Thus, similar process steps can be used to fabricate a double-gate MOSFET with a strained channel. Thus, each device has its own backgate to control the threshold voltage (Vt), thereby reducing the power dissipation of the circuits.

Figure 10:
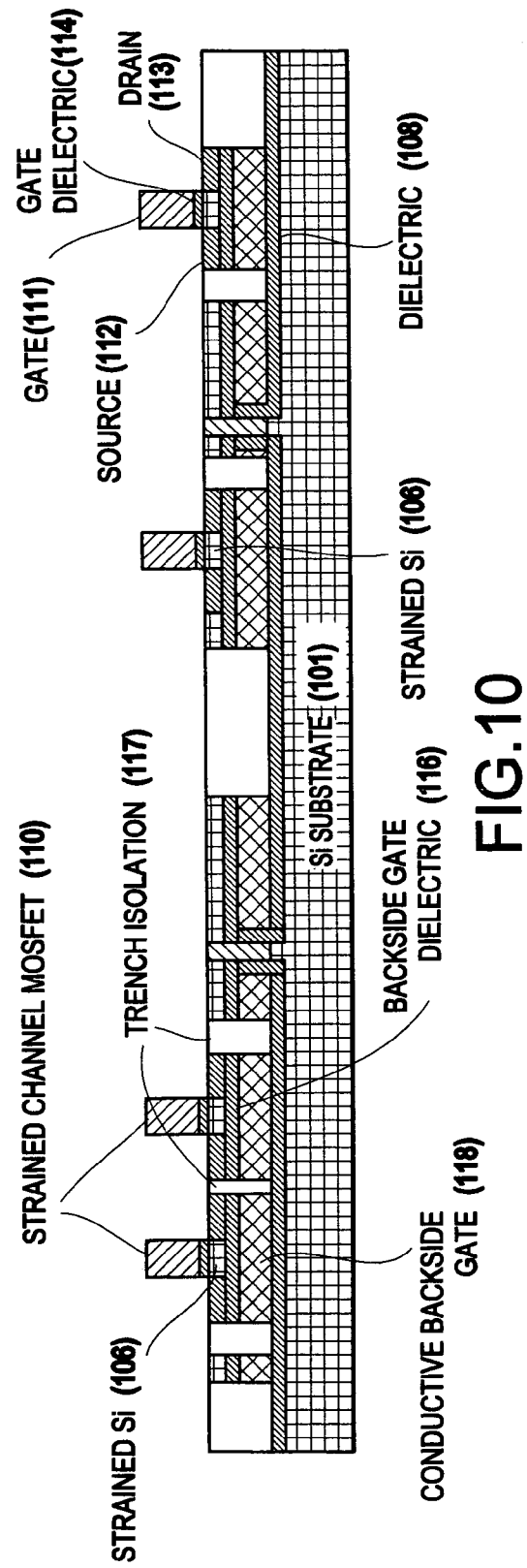
FIG. 10 illustrates a double-gate (top and bottom) MOSFET device on strained-silicon-on-insulator with trench isolation.

Specifically, referring to FIG. 10, trenches 117 are etched and filled with an insulating material such as oxide to isolate single devices. Following the trench isolation step, the wafer surface is completely planarized (e.g., by chemical mechanical polishing (CMP) or the like) since the gaps between the strained-silicon areas are also filled with the insulating material as the etched trenches 117.

It is noted that the backside gate 118 of each device forms a fourth terminal to the strained-channel MOSFET 110 and modulates the device current like the top gate 111. Typically, a MOSFET has only three (3) terminals including a source, drain, and gate. However, in FIG. 10, a four-terminal device is shown, including a source and a drain, as well as first and second gates.

The top and bottom gates 111 and 118 can be used together (e.g., thereby to have twice the current as that with a single gate device), or can be used independently (e.g., are electrically separable). This independent use of the gates would allow the device to function as a logic gate with two different controls. The backside gate 118 and the backside gate dielectric 116 can be formed of a different material and have thicknesses different than their top counterparts 111 and 114.

Second Embodiment

Turning now to FIG. 11 and to a different structure, it is noted that bowing occurs since the free-standing structure includes a bilayer of two mismatched materials such as SiGe over silicon. The bowing can be prevented by sandwiching the SiGe 107 film between two silicon films (106 and 120) of equal thicknesses, as was discussed above and shown in FIGS. 2-6. The sandwiched SiGe film 107 does not bow since the silicon layer 106 balances the silicon cap layer 120.

Hence, whereas before in FIGS. 2-6, a sandwich layer was shown of relaxed SiGe with strained silicon on first and second sides (e.g., top and bottom), in FIGS. 11-12, a first side (e.g., the top) of the strained silicon has been removed.

However, the use of a cap layer 120 decreases the degree of strain relaxation in SiGe film 107, since the total silicon film thickness, $t_{Si}$, is twice as thick compared with a bilayer structure (e.g., SiGe over silicon without a silicon cap).

Thus, it is possible to use a bilayer and reduce bowing in a controlled fashion (but not completely eliminate it) by using a very short pedestal to support the free-standing film, as shown in FIGS. 11 and 12.

That is, when the pedestal 154 is made very short, the bilayer film (156 and 157) is forced to remain nearly flat since the amount of bowing is limited by the substrate 151. On the other hand, when the pedestal 144 is tall, the film can bow without abutting the substrate 141 and more curvature is obtained.

To achieve optimal bowing, it is noted that the pedestal is not limited to any particular height, but preferably has a height related to a length of the free-standing structure. In one example, the length of the free-standing structure may be quite long (e.g., up to 10 microns or 100,000 Å), whereas the pedestal may have a height of about 100 Å, or a factor of 1/1000. Hence, the structure would be substantially flat, as the structure would taper equally from the pedestal down to the edge. Thus, this would represent one way of eliminating one of the strained silicon layers on a side (e.g., on the top) of the relaxed SiGe, and yet prevent the problem of bowing.

Third Embodiment

It is noted that the fabrication of a free-standing structure according to the present invention does not necessarily require the use of a SOI wafer, but can also be achieved with a bulk silicon wafer as the starting wafer. This allows the integration of mixed complementary metal oxide semiconductor (CMOS) technologies (e.g., bulk Si CMOS with SSOI CMOS, etc.).

Referring now to FIGS. 13-20, a bulk silicon substrate 121 is implanted with a p-type dopant such as boron. The implant forms a buried p-doped layer 122 which is capped by an undoped silicon layer 123, as shown in FIG. 13. Alternatively, the p-doped layer 22 can be realized by in-situ doped epitaxial growth of p-type silicon followed by an epitaxial growth of undoped silicon to form the cap layer 123.

The pedestal location is defined by a masked implant that forms a localized pillar of doped silicon 122A. The structure is then annealed to activate the dopants. The pedestal can also be formed by the "drill and fill" technique described above by which, at a location of the pedestal, a hole is etched, and then filled with a material that is selective to a silicon etch.

As shown in FIG. 14, a layer of fully strained (e.g., substantially no defects) SiGe 124 is epitaxially grown over the silicon film 123. Again, the SiGe 124 accommodates to the silicon lattice constant by being compressively strained.

As shown in FIG. 15, the strained SiGe film 124 is patterned, and the silicon layer 123 is etched selectively with respect to the SiGe and the doped regions 122 and 122A. Thus, the silicon layer 123 will be etched and the SiGe and the doped regions will not be etched (e.g., SiGe and the doped regions will operate as a stop etch). An example of a silicon etchant that is selective to SiGe and p-type silicon is TMAH (Tetramethylammonium Hydroxide). As would be known by one of ordinary skill in the art taking the present application as a whole, many other etchants can be used.

The etching of the silicon film 123 produces a free-standing structure supported only by a pedestal 125, and thereby allows the strain in the SiGe film 124 to relax, so that the SiGe assumes its bulk lattice constant and becomes "relaxed SiGe" 127. Testing by the present inventors has exemplarily shown that the relaxed SiGe has achieved a relaxation on the order of 99% relaxation as though the SiGe 127 has been formed on a bulk SiGe structure (if such a structure would exist).

A silicon film 126 is epitaxially grown over the relaxed SiGe 127 film. The silicon film 126A is also deposited over the silicon layer 122, and the pedestal 125, as shown in FIG. 16. If the pedestal is made of a dielectric material such as $SiO_2$ or $Si_3N_4$, then the silicon epitaxy can be made selective (i.e., grows only on Si or SiGe surfaces), and no deposition of silicon will occur on the pedestal. It is noted that the silicon film 126 grows strained since the free-standing SiGe film 127 used as the epitaxial template was "relaxed."

Referring to FIG. 17, a dielectric film 128 (e.g., $SiO_2$ or the like) is conformally deposited over the free-standing structure and the substrate 121.

As shown in FIG. 18, a filling material 129 is conformally deposited so that the filling material 129 fills the space under the free-standing structure. As explained above, the filling material can be an insulator such as silicon-nitride or silicon-dioxide. If a backside gate functionality is desired, then the filling material 129 can be a conductive material such as doped polysilicon or a metal.

Figure 19:
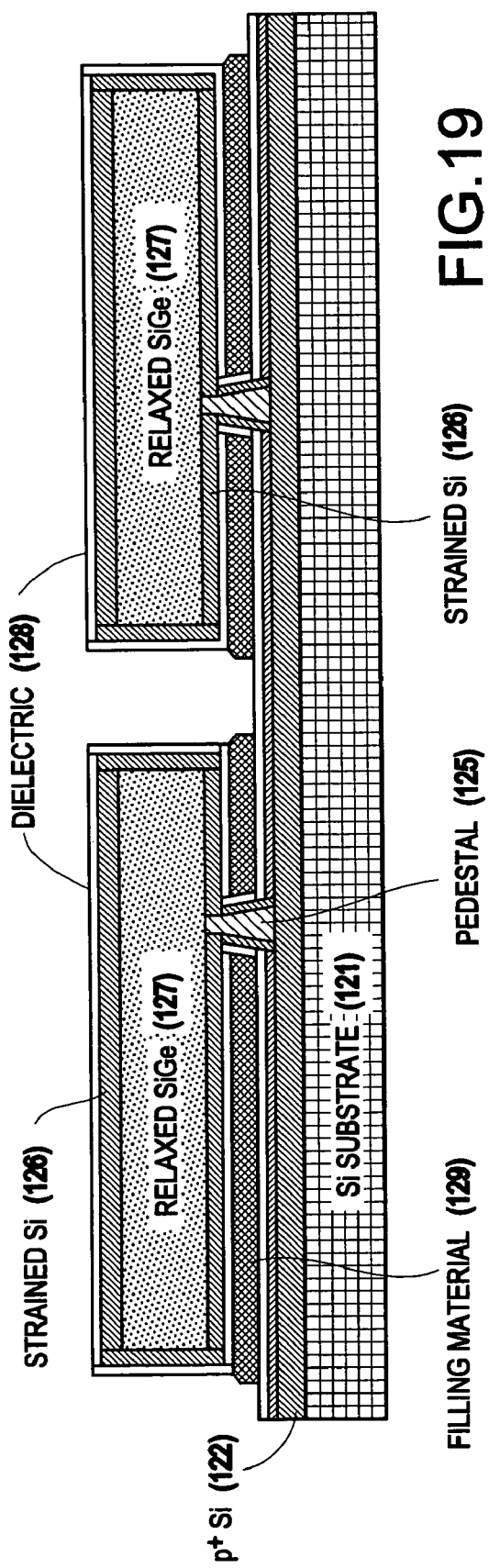

Referring to FIG. 19, the filling material 129 is etched everywhere except from where the filling material fills the gap between the substrate and the free-standing structure. The exposed portion of the dielectric layer 128 is then etched and the strained-silicon film 126 over the SiGe film 127 and its sidewalls are also etched.

Figure 20:
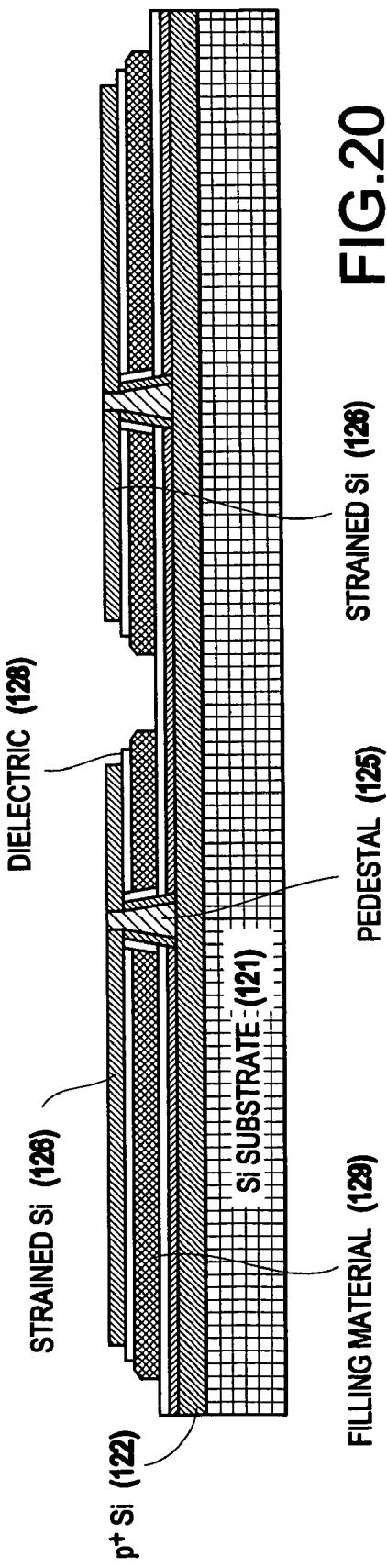

As shown in FIG. 20, the relaxed SiGe film is selectively etched leaving a strained-silicon film 126 on an insulator. It is noted that the structure of FIG. 20 which was made on a bulk silicon substrate is nearly identical to that shown in FIG. 7 which was made with an SOI wafer.

Now, a device can be built using the strained silicon film on an insulator (using a bulk silicon substrate) of this embodiment, as described above.

Fourth Embodiment

FIGS. 21-25 describe an embodiment in which a free-standing silicon film 136 is strained by the deposition of a straining material 137. It is assumed in this embodiment a BOX 132 and SOI 133 is used. Of course, a bulk silicon substrate could be used instead, as demonstrated above.

Figure 21:
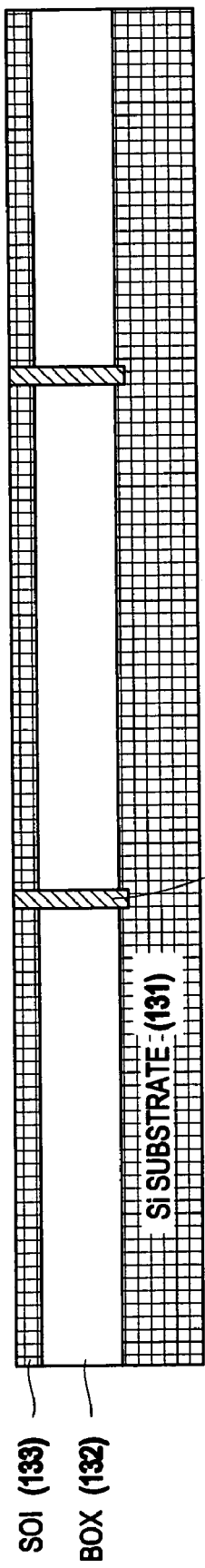
Figure 22:
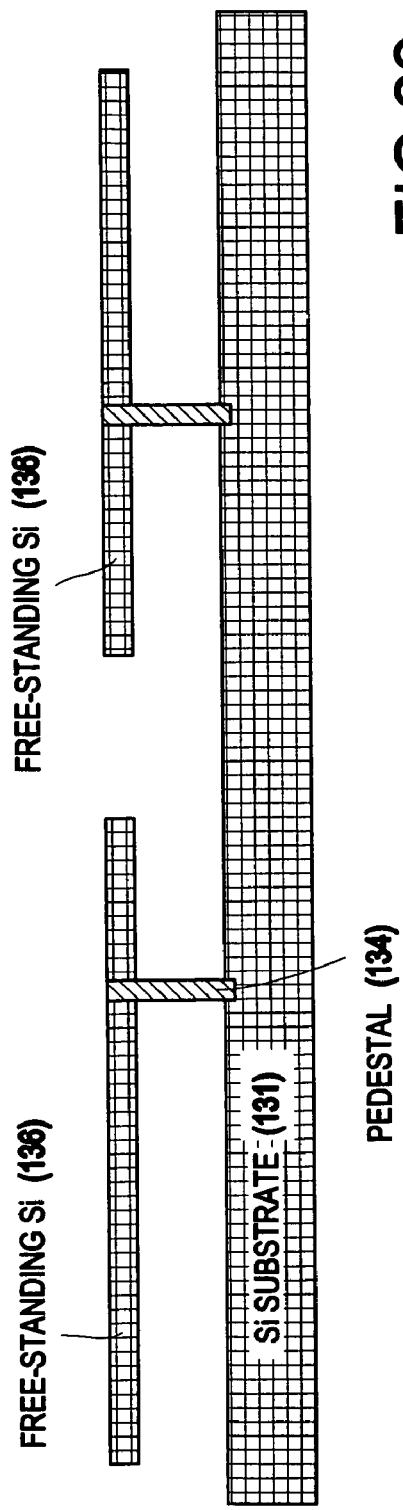

As shown in FIGS. 21-22, a free-standing silicon film 136 is formed by first forming a pedestal 134, patterning the SOI film 133, and etching the BOX 132.

Then, as shown in FIG. 23, a straining material 137 is deposited over the free-standing silicon and over the silicon substrate 131.

An exemplary feature of this embodiment is that the straining material can be many materials (e.g., SiGe, or a material other than SiGe such as a layer of silicon nitride, etc.). Hence, the straining material 37 can be deposited as single-crystal by epitaxy, or it can be deposited as an amorphous or polycrystalline material. Examples of single-crystal materials are SiGe, SiC or metal-oxides such as $Al_2O_3$. Examples of straining materials that can be deposited in an amorphous form are dielectrics such as $Si_3N_4$ and metal-oxides (e.g., metal oxide can be deposited in an amorphous or a single-crystal form).

The straining material can be compressive or tensile, depending upon the type of strain desired. Thus, if a compressive strain is desired, then a material having a smaller lattice constant may be selected. Conversely, if a tensile strain is desired, then a material having a larger lattice constant such as SiGe or the like may be used. Based on the straining material, the strained silicon layer 138 could be strained optimally in both directions, depending upon the straining material selectively employed.

Hence, optimal materials could be employed as the straining material based on the material's availability, other qualities or properties of the material, ease of processing of a material, etc.

That is, if a nitride (e.g., $Si_3N_4$) could be made to work substantially in the same manner as SiGe, then a nitride could be utilized, thereby making the entire process easier since an epitaxial step could be avoided instead of a simpler deposition step. Thus, materials providing easier processing, greater availability of materials, etc. could be employed. As an example, a nitride deposition can eliminate a more expensive SiGe epitaxial growth step.

A filling material 139 is deposited to fill the gap between the substrate 131 and the free-standing structure. Thus, the previously free-standing structure is held in place by the filling material.

Then, as shown in FIG. 24, the filling material 139 is etched by RIE except from where it is covered (shadowed) by the silicon film 138.

It is noted that, if the deposition of the straining material 137 is such that the thickness of the deposited film is about half (or more) of the spacing between the substrate 131 and the free-standing silicon film 136, then the straining material will fill the gap and the deposition of the filling material 139 is not needed.

Figure 25:
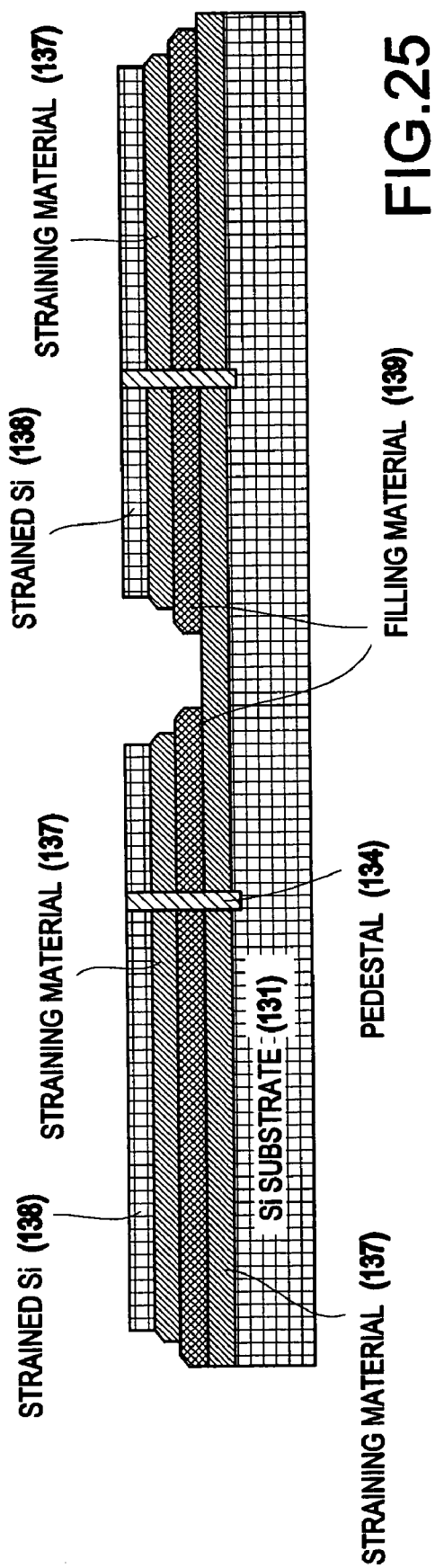

As shown in FIG. 25, the exposed portion of the staining material is etched leaving a strained silicon film 138 over a straining material 137 that is attached to the substrate 131 by a filling material 139.

Fifth Embodiment

The above embodiments can be used to fabricate a mixed technology circuit in which strained-SOI and conventional SOI technology, or strained-SOI and bulk technology are monolithically integrated.

Figure 26:
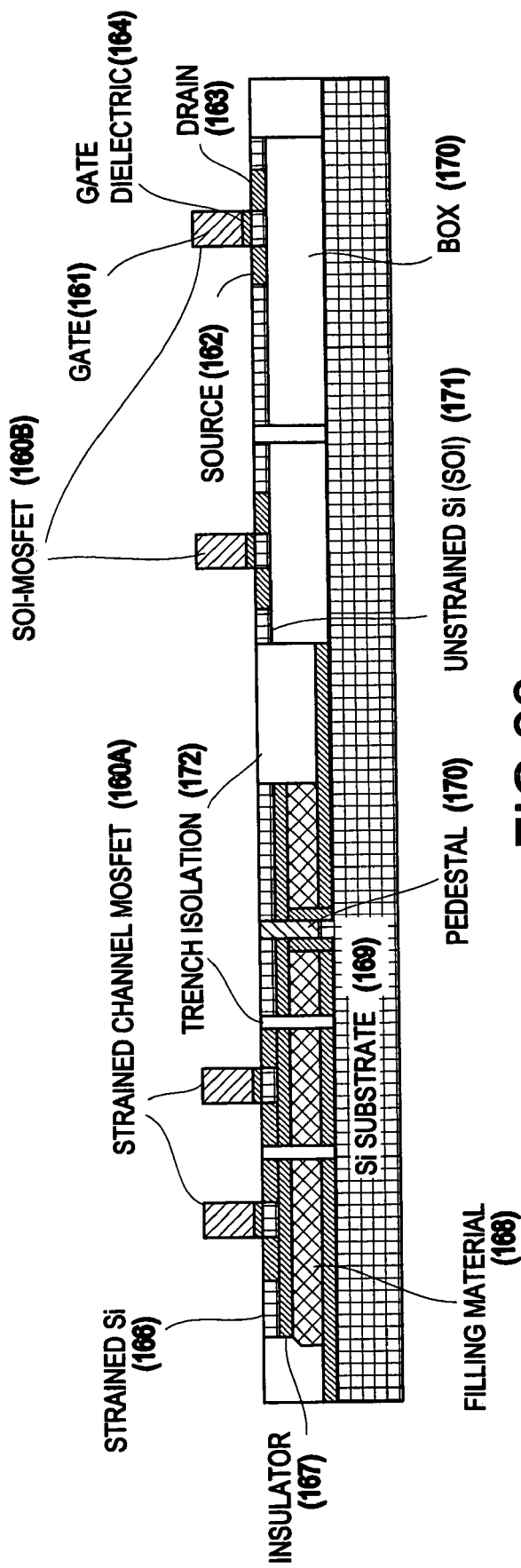
FIGS. 26 and 27 illustrate methods of forming a mixed technology device, and specifically.

As shown in FIG. 26, a mixed technology chip showing a strained channel MOSFET-on-insulator 160A integrated with a conventional SOI MOSFET 160B.

The strained channel MOSFET 160A was fabricated by using a SOI wafer as a starting wafer, and by following the process steps described above and shown in FIGS. 1-10. The conventional SOI MOSFET 60B was fabricated on areas that were excluded from the fabrication of the free-standing structure.

A key feature of all the methods discussed here is that the strained-silicon surface 166 lies in the same plane (e.g., has the same height) as the unstrained silicon (SOI) 171 surface. This exemplary feature eliminates topography issues, and allows easy planarization (e.g., for trench isolation). Of course, the gaps between islands should be filled with some type of trench isolation material (e.g., oxide), but the silicon itself is neither lower nor higher than the original SOI. It is the same material, and it has neither been moved in the vertical direction.

Figure 27:
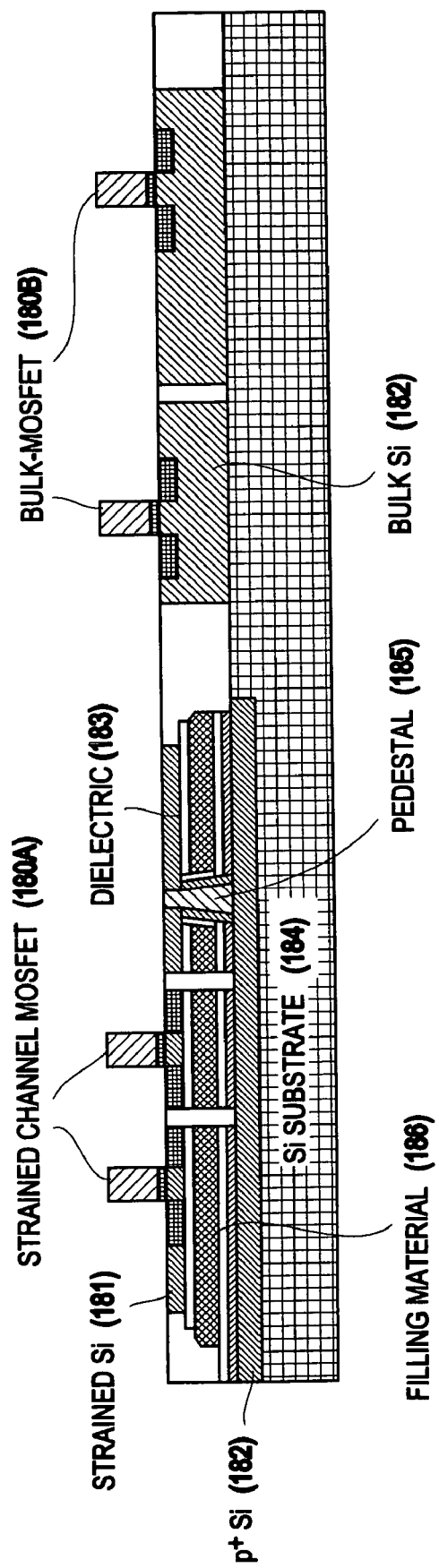

As another example, FIG. 27 illustrates a strained channel MOSFET-on-insulator 180A integrated with a conventional bulk silicon MOSFET 180B.

The strained channel MOSFET 180A was fabricated on a bulk silicon starting wafer, as described above with regard to FIGS. 13-20.

That is, the choice of starting material or starting wafer may depend upon what the designer wishes to end up with as the mixed technology. For example, bulk CMOS technology is more easily integrated with DRAM technology. Indeed, DRAM cells are formed by etching very deep trenches into the Si substrate that form the DRAM capacitors. A reason why the capacitor should not go on the surface is that space is critical, especially as density of cells becomes higher and higher. Burying the capacitor vertically in the substrate saves space and chip "real estate". With such a vertical capacitor, a buried oxide (as in SOI technology) cannot be used since such deep trenches would penetrate the buried oxide. Hence, if an embedded memory were needed, then at least some areas of the device would require a bulk Si substrate.

In sum, there are some situations in which mixed technology would be advantageous and which would require bulk and some which would require an SOI wafer.

Returning to FIG. 27, the bulk MOSFET 180B was fabricated on non-patterned areas of the wafer (e.g., areas that were excluded from the fabrication of the free-standing structure). As for the SOI case, the strained-silicon surface 181 lies in the same plane (e.g., have the same height) as the bulk silicon 182 surface. Thus, there are no topography issues to consider.

It is noted that the p+ Si layer 182 extending over to the bulk silicon area need not be continuous, and indeed may be discontinuous (e.g., disjointed, broken, etc.). Thus, the layer 182 need not be continuous across the wafer, and the implant need not be continuous. The designer can define the desired areas where the p+ implant is made.

Sixth Embodiment:

In another aspect of the invention, the above techniques can be advantageously applied to circuit design.

That is, the above techniques can be advantageously used by a circuit designer in designing a method and software program to develop a method of forming a circuit layout which is preferably segmented into sub-areas which define where a free-standing film area will be fabricated. In each sub-area, the location of a single supporting pedestal is determined. The segmentation to free-standing areas and allocation of the pedestal are based on circuit design rules and can be performed automatically by a computer program.

Figure 28:
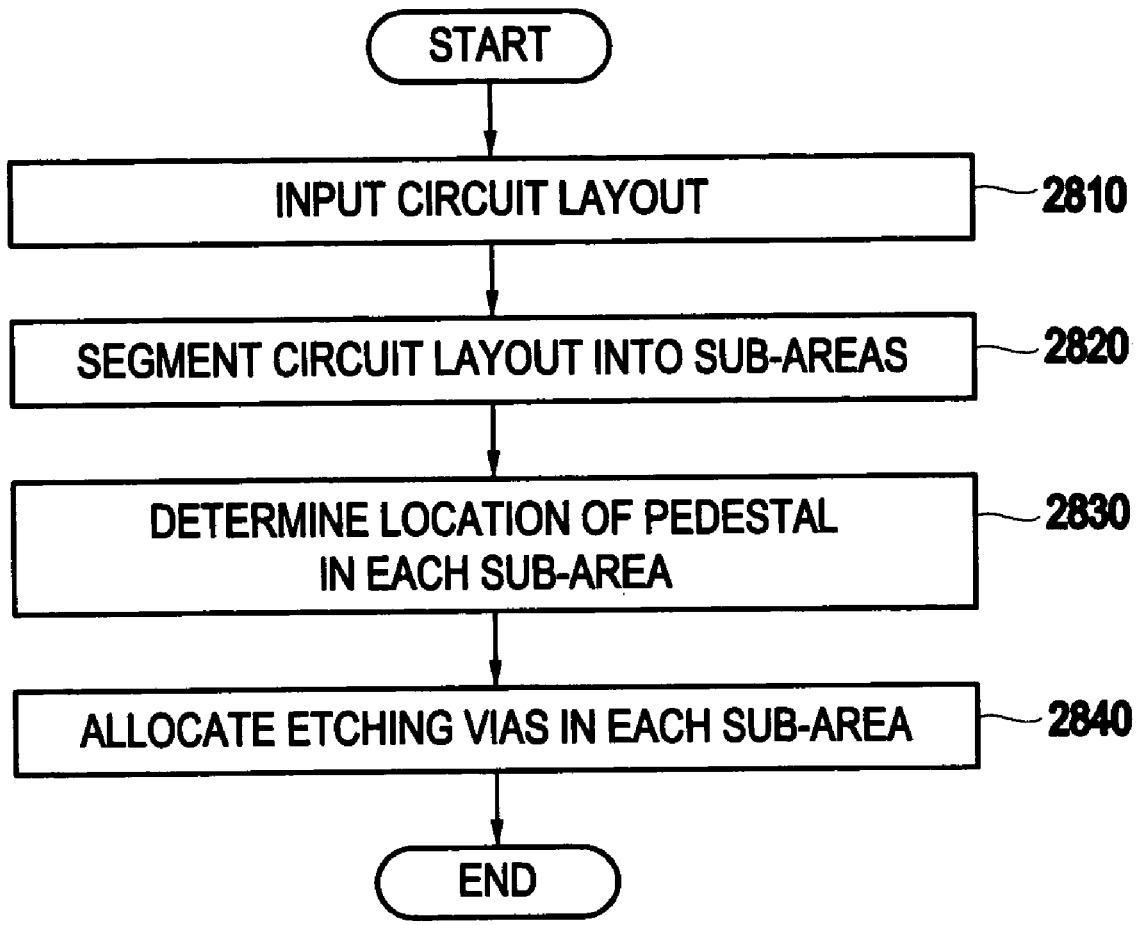
FIG. 28 illustrates a flowchart of a method 2800 of forming a circuit layout employing the techniques of the present invention.
Figure 29:
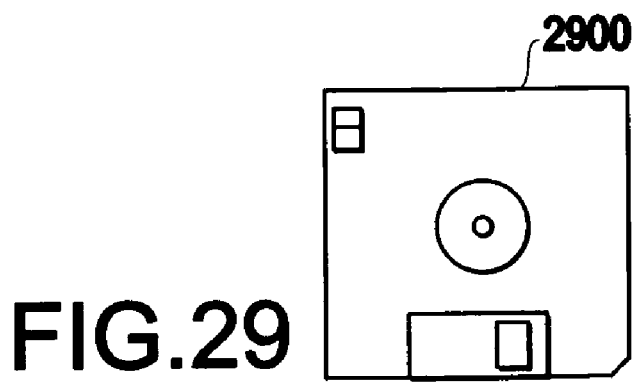
FIG. 29 illustrates a program storage device (e.g., signal-bearing medium) 2900 for storing a program of the method 2800 therein.

FIG. 28 illustrates a flowchart of a method 2800 of how a designer (possibly knowing little or nothing about how exactly to fabricate strained-silicon, etc.) would take the above techniques to design a method and software program for optimally forming a circuit layout.

First, in step 2810, a circuit layout template is input including circuit design rules.

Then, in step 2820, the circuit layout is segmented into sub-areas (e.g., islands, etc.) which define where a free-standing film area will be fabricated (e.g., where the strained-silicon film etc. will be formed).

Then, in step 2830, in each sub-area, the location of a single supporting pedestal (and/or an unstrained silicon film) is determined. The segmentation to free-standing areas and allocation of the pedestal are based on the circuit design rules (e.g., the pedestal can be defined in a certain area as long as this line or this region is not crossed, the pedestal can be placed in a certain area but cannot be built to overlap a certain kind of layer, etc.), and can be performed automatically by a computer program.

Thus, the optimized circuit layout is formed. Thereafter, a post-processor or the like is run having design ground-rules, thereby to form the layout.

The procedure for segmenting the layout can seek a segmentation in which the sub-areas are roughly of similar area size. This will help to achieve an equal etching time of the BOX under each sub-area.

In a different segmentation approach, the equal sub-area criterion can be relaxed. Instead, additional openings in the free-standing film area are introduced to equalize the etching time of the BOX 202 under large area free-standing films and under small area free-standing films. This idea is also illustrated in FIGS. 30A and 30B.

Figure 30B:
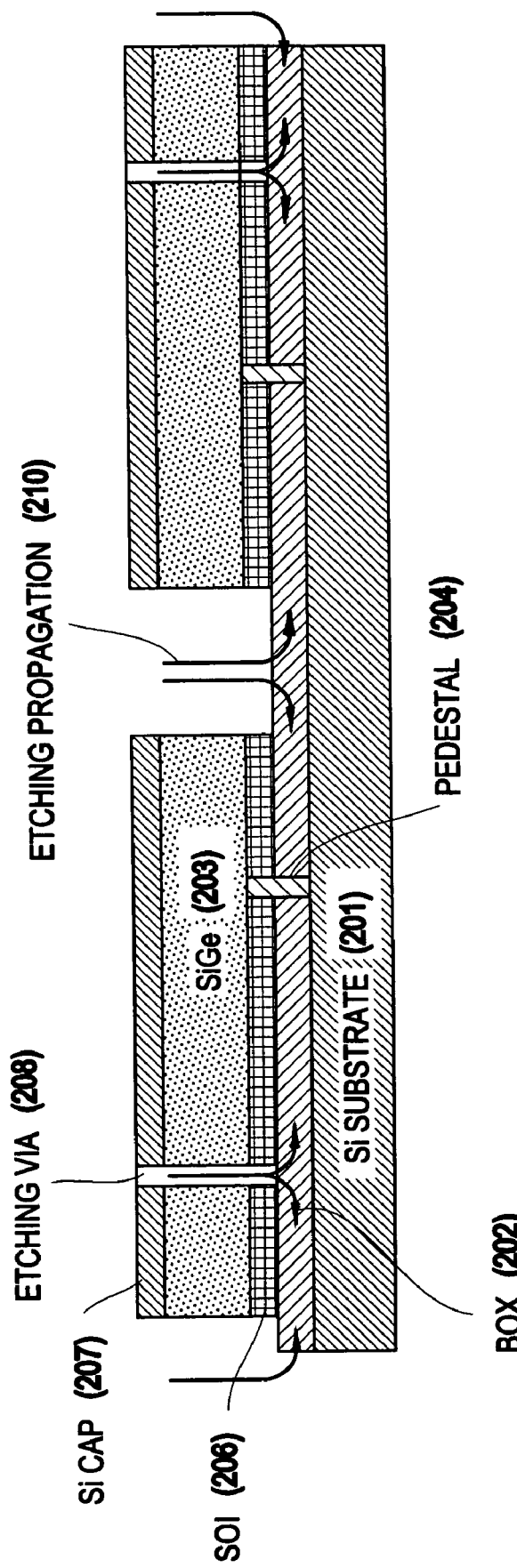
Figures 31A, 31B:
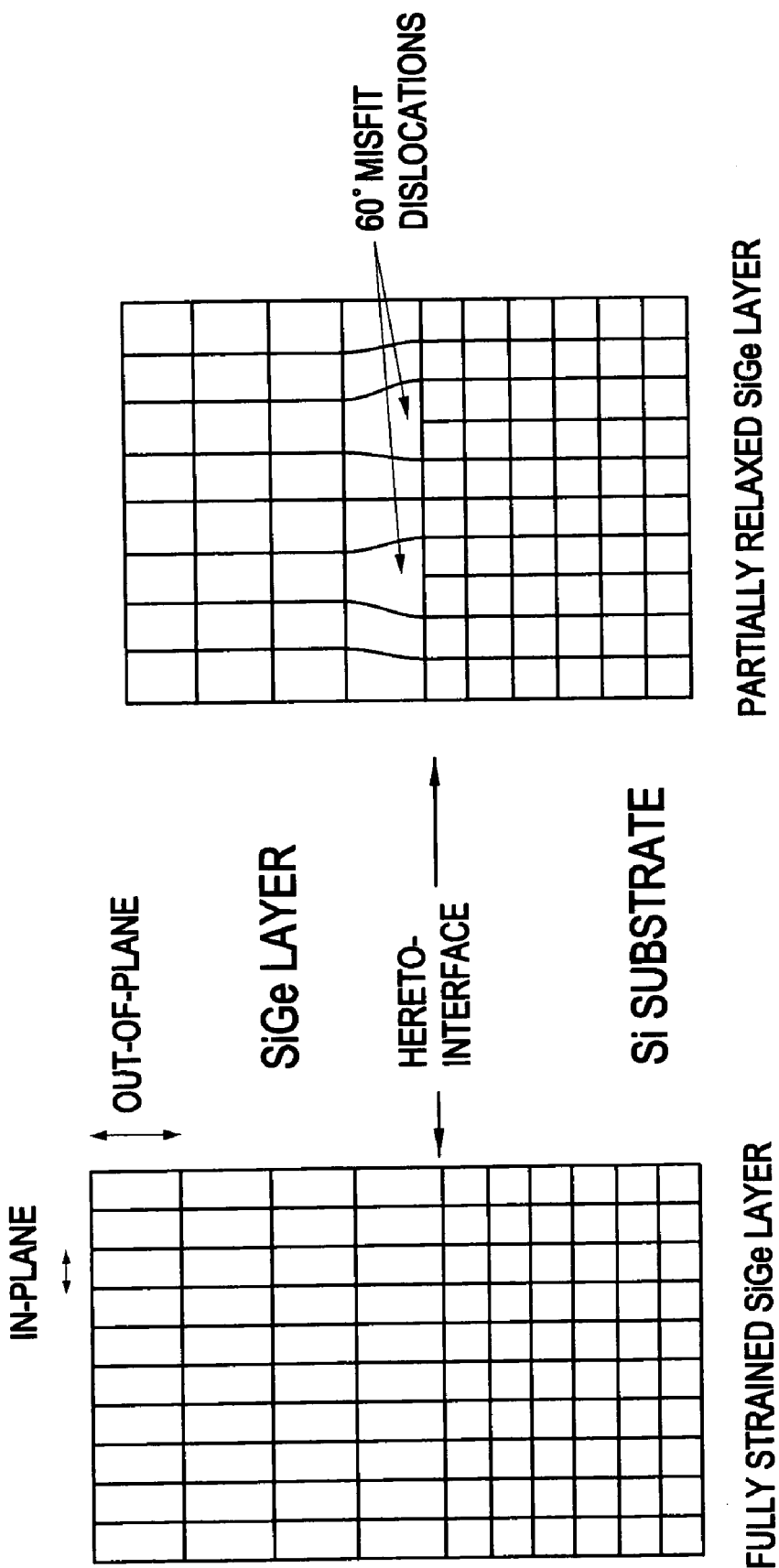
FIG. 31A illustrates a lattice cell deformation of a fully strained SiGe film grown on Si.
FIG. 31B illustrates a lattice cell deformation of a partially relaxed SiGe film grown on Si.
Figure 31C:
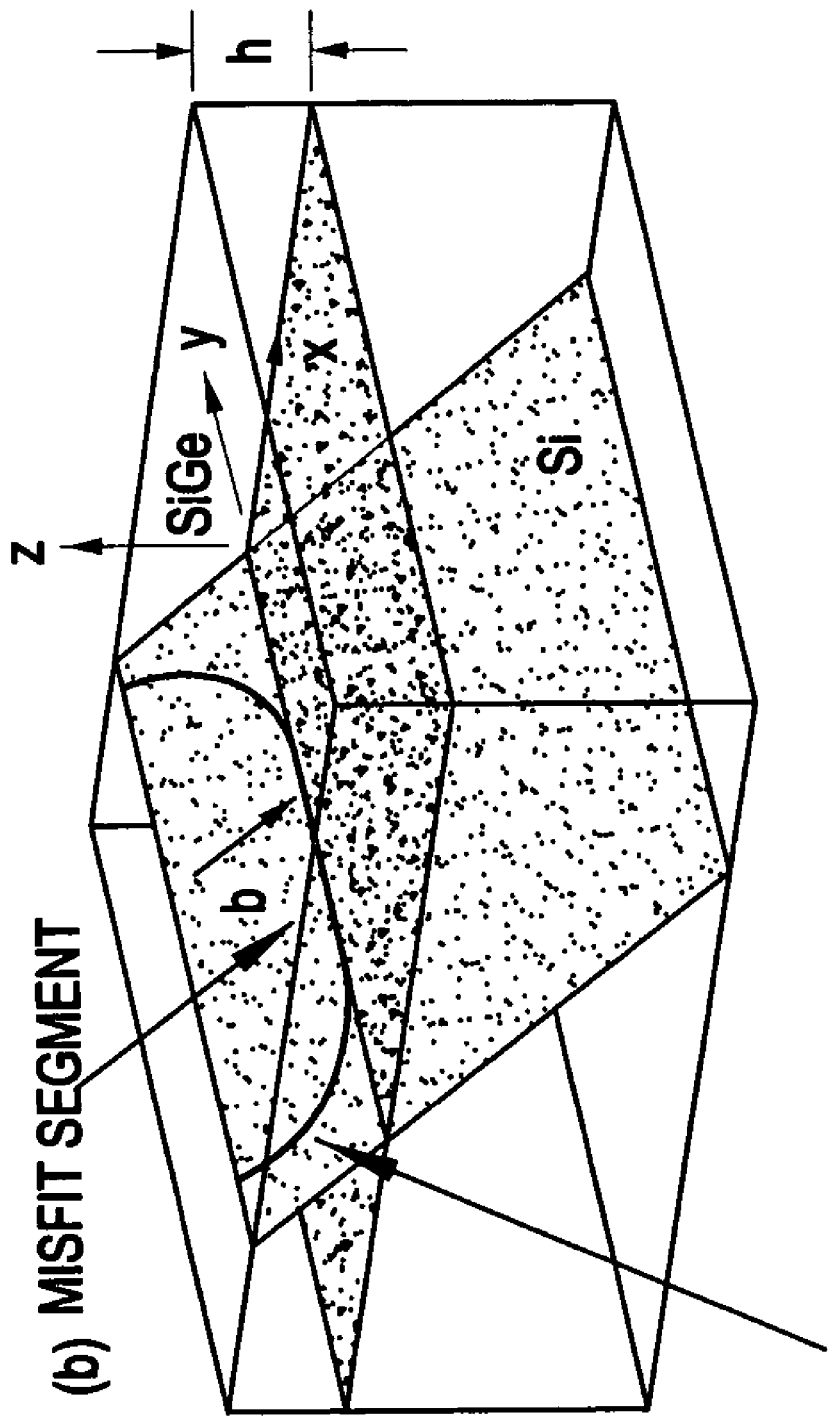
FIG. 31C illustrates a dislocation defect in a SiGe film grown on Si.

That is, FIG. 30A is a top view and FIG. 30B is a cross-sectional view along a line $B_1$-$B_2$, respectively illustrating the use of etching vias 208 as a method for accelerating the etching of the BOX under large free-standing areas. Reference numeral 210 and the arrows (unreferenced) in FIG. 30B illustrate the etching propagation.

More specifically, when forming the areas of the free-standing films, the BOX 202 is etched away leaving the pedestal. The etching of the BOX takes some time, depending upon how long it takes for the solution to propagate to reach the pedestal 204 on substrate 201. Thus, two free-standing film areas which are very different in size (e.g., large and small) will take different times to etch. That is, the larger area will generally take longer to etch. This different etching time is not necessarily desirable, and it would be advantageous to have all areas be etched at approximately the same time.

Thus, either the sub-areas can be made to be approximately the same size as discussed above, or etching vias 208 (e.g., small holes), as shown in FIGS. 30A and 30B, can be introduced into the free-standing film (through the silicon cap 207, SiGe 203 and SOI 206) such that the etchant solution which etches the BOX, is allowed to enter not only from the sides, but also from the top (e.g., see arrows in FIG. 30B), of the free-standing film. Thus, the etching of the BOX can be equalized regardless of the relative size of the free-standing film areas.

Additionally, free-standing fill-shapes can be intentionally added into areas of the chip with sparse SSOI device population to equalize the density of free-standing structures over the chip. This increases the uniformity of processes such as RIE and CMP.

Thus, in addition to the structure and method for forming the structure as described and shown in FIGS. 1-27, this different aspect of the invention includes a computer-implemented method for forming and optimizing the circuit layout by a designer.

Such a method may be implemented, for example, by operating a computer, as embodied by a digital data processing apparatus, to execute a sequence of machine-readable instructions. These instructions may reside in various types of signal-bearing media.

This signal-bearing media may include, for example, a RAM contained within a CPU, as represented by the fast-access storage for example, or able to be provided over a network or the like. Alternatively, the instructions may be contained in another signal-bearing media, such as a magnetic data storage diskette 2900 shown in FIG. 29, directly or indirectly accessible by the CPU.

With the unique and unobvious combination of exemplary features of the invention, an exemplary method (and resulting structure) are provided for forming novel a strained-silicon-on insulator MOSFET with a single or a double gate, and to a method of forming a novel strained-silicon-on-insulator structure.

Additionally, the present invention eliminates the difficulties inherent in the conventional methods, by teaching away from wafer bonding and by using elastic relaxation of the SiGe layer (e.g., which occurs without the introduction of defects in contrast to plastic relaxation which is used by conventional methods).

Further, as described above, the present invention provides a method for forming a strained silicon layer on a thin insulator over a conductor, which creates a starting substrate for making a strained-silicon channel double-gate MOSFET.

Additionally the present invention teaches that strained Si MOSFETs can be monolithically integrated with standard bulk Si CMOS or with SOI CMOS.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

The invention claimed is:

1. A semiconductor substrate, comprising:
   a substrate;
   a free-standing structure comprising a strained silicon film supported at a single point by a pedestal;
   a first dielectric film formed on said substrate and on said free-standing structure; and
   a filling material formed between said free-standing structure and said substrate,
   wherein said filling material attaches said free-standing structure to the substrate.

2. The substrate of claim 1, wherein said strained silicon film includes a distorted crystal lattice cell.

3. The substrate of claim 1, further comprising:
   a buried doped silicon film formed under the strained silicon film.

4. The substrate of claim 1, wherein the filling material comprises an insulator material.

5. The substrate of claim 1, wherein the filling material comprises a conductive material.

6. A semiconductor structure, comprising:
   a substrate;
   a free-standing structure comprising a silicon film and a stressor film, wherein said stressor film induces strain in said silicon film; and
   a filling material formed between said free-standing structure and said substrate,
   wherein said filling material attaches firmly said silicon film to the substrate, and
   wherein the attachment of the silicon film to the substrate by said filling material secures the strain induced in said silicon film.

7. The structure of claim 6, wherein said stressor film is etched selectively and completely with respect to said attached silicon film, and wherein said filling material holds the silicon film having the strain induced therein, from relaxing.

* * * * *